United States Patent
Sakakima et al.

(10) Patent No.: US 6,567,246 B1
(45) Date of Patent: May 20, 2003

(54) MAGNETORESISTANCE EFFECT ELEMENT AND METHOD FOR PRODUCING THE SAME, AND MAGNETORESISTANCE EFFECT TYPE HEAD, MAGNETIC RECORDING APPARATUS, AND MAGNETORESISTANCE EFFECT MEMORY ELEMENT

(75) Inventors: Hiroshi Sakakima, Kyoto (JP); Yasunari Sugita, Osaka (JP); Mitsuo Satomi, Osaka (JP); Yasuhiro Kawawake, Kyoto (JP); Masayoshi Hiramoto, Nara (JP); Nozomu Matsukawa, Nara (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/516,552

(22) Filed: Mar. 1, 2000

(30) Foreign Application Priority Data

| Mar. 2, 1999 | (JP) | 11-054077 |
| Mar. 26, 1999 | (JP) | 11-083305 |
| May 17, 1999 | (JP) | 11-135280 |
| Jul. 2, 1999 | (JP) | 11-188723 |
| Aug. 23, 1999 | (JP) | 11-235053 |
| Dec. 14, 1999 | (JP) | 11-354327 |

(51) Int. Cl.$^7$ ............... G11B 5/127; G11B 5/39
(52) U.S. Cl. ................... 360/324.11; 360/313
(58) Field of Search .............. 360/324.11, 324.1, 360/324.12, 324, 313, 314; 324/252; 365/758

(56) References Cited

U.S. PATENT DOCUMENTS

| 5,949,622 A | * | 9/1999 | Kamiguchi et al. | 360/324.12 |
| 6,031,692 A | * | 2/2000 | Kawawake et al. | 360/324.12 |
| 6,052,262 A | * | 4/2000 | Kamiguchi et al. | 360/324.12 |
| 6,054,226 A | * | 4/2000 | Takeda et al. | 428/682 |
| 6,169,688 B1 | * | 1/2001 | Noguchi | 365/171 |
| 6,258,470 B1 | * | 7/2001 | Sakakima et al. | 324/252 |
| 6,348,274 B1 | * | 2/2002 | Kamiguchi et al. | 428/692 |
| 6,407,890 B1 | * | 6/2002 | Gill | 360/314 |
| 6,430,013 B1 | * | 8/2002 | Pinarbasi | 360/324.12 |
| 6,495,275 B2 | * | 12/2002 | Kamiguchi et al. | 428/692 |

FOREIGN PATENT DOCUMENTS

| EP | 0 687 917 A2 | 12/1995 |
| EP | 0 780 912 A1 | 6/1997 |
| EP | 0 917 161 A1 | 5/1999 |

OTHER PUBLICATIONS

European Search Report, Application No. EP 00 10 4409, dated Nov. 22, 2000.
XP 000641747. Sakakima et al.; "Magnetoresistance in CoMnB/Co(Fe)/Cu/Co(Fe) Spin–Valves"; Journal of Magnetism and Magnetic Materials 1997; vol. 165, pp. 108–110.
XP 000634085. Hasegawa et al.; "Spin–Valves with Antiferromagnetic a–Fe$_2$ Layers"; IEEE Transaction on Magnetics, vol. 32, No. 5, Sep. 1996.

* cited by examiner

*Primary Examiner*—David L. Ometz
*Assistant Examiner*—Angel Castro
(74) *Attorney, Agent, or Firm*—Renner, Otto, Boisselle & Sklar

(57) ABSTRACT

A magnetoresistance effect element includes a free layer, in which a magnetization direction thereof is easily rotated in response to an external magnetic field, a first non-magnetic layer, and a first pinned layer provided on a side opposite to the free layer of the first non-magnetic layer, in which a magnetization direction of the first pinned layer is not easily rotated in response to the external magnetic field. At least one of the first pinned layer and the free layer includes a first metal magnetic film contacting the first non-magnetic layer, and a first oxide magnetic film.

28 Claims, 13 Drawing Sheets

MAGNETORESISTANCE EFFECT ELEMENT AND METHOD FOR PRODUCING THE SAME, AND MAGNETORESISTANCE EFFECT TYPE HEAD, MAGNETIC RECORDING APPARATUS, AND MAGNETORESISTANCE EFFECT MEMORY ELEMENT

BACKGROUND OF THE INVENTION

1. Field of the Invention

The present invention relates to a magnetoresistive effect element which produces a high level of output to an outside magnetic field in response to a change in a magnetoresistance. The present invention also relates to a magnetoresistance effect type head including the element suitable for high-density magnetic recording and reproduction, and a magnetic recording apparatus such as a hard disk drive including the head, and methods for fabricating the element, the head, and the apparatus.

2. Description of the Related Art

Recently, hard disk drives (HDD) have been rapidly developed to have more high density capability, and significant advances have been made in reproduction magnetic heads for reading magnetization recorded on such a medium. Among other things, a spin valve which is a magnetoresistance effect element (hereinafter referred to as an MR element) utilizing a giant magnetoresistance effect has been thought to increase the sensitivity of current magnetoresistance effect type heads (hereinafter referred to as an MR head) and is being vigorously studied.

The spin valve includes a non-magnetic layer and two ferromagnetic layers. The non-magnetic layer is sandwiched between the two ferromagnetic layers. The magnetization direction of one of the ferromagnetic layers (pinned layer) is pinned by an exchange bias magnetic field of a pinning layer (the ferromagnetic layer and the pinning layer are referred to collectively as an exchange coupling layer). The magnetization direction of the other ferromagnetic layer (free layer) is allowed to move relatively freely in response to an external magnetic field. The electric resistance of the spin valve is changed according to the angle between the magnetization directions of the pinned layer and the free layer.

Journal of Magnetism and Magnetic Materials 93, p. 101, 1991 discloses a spin valve which includes magnetic layers made of Ni—Fe, a non-magnetic layer made of Cu, and a pinning layer made of Fe—Mn. This spin valve has a magnetoresistance change rate (hereinafter referred to as an MR ratio) of approximately 2%. When the pinning layer is made of Fe—Mn, the MR ratio is small and the blocking temperature (temperature at which a magnetization pinning effect of the pinning layer on the pinned layer vanishes) is not sufficiently high. In addition, Fe—Mn has less corrosion resistance. Therefore, other spin valves have been proposed which include a pinning layer made of a variety of material. Among other things, Pt—Mn has good corrosion-resistance and thermal stability. A pinning layer made of an oxide such as NiO and $\alpha$-$Fe_2O_3$ allows the spin valve to have a very high MR ratio of 15% or more.

However, the spin valve including an NiO pinning layer does not have a sufficiently high blocking temperature, so that the NiO spin valve has less thermal stability.

The $\alpha$-$Fe_2O_3$ spin valve has disadvantage such that a pinning effect on the metal magnetic layer is weak. Particularly, when the spin valve has a dual spin valve structure or when a structure such that the $\alpha$-$Fe_2O_3$ layer is provided on the pinned layer, such disadvantage is significant in the $\alpha$-$Fe_2O_3$ layer. The Pt—Mn spin valve has excellent thermal stability, but does not have as high a MR ratio as the NiO or $\alpha$-$Fe_2O_3$ spin valve. Therefore, the thermal stability as exhibited by Pt—Mn and the large MR ratio is exhibited by NiO or $\alpha$-$Fe_2O_3$ have not been achieved in one element.

Moreover, a small total thickness of the metal layers and a higher MR ratio are required for the magnetoresistance effect element.

SUMMARY OF THE INVENTION

According to one aspect of the present invention, a magnetoresistance effect element includes a free layer, in which a magnetization direction thereof is easily rotated in response to an external magnetic field; a first non-magnetic layer; and a first pinned layer provided on a side opposite to the free layer of the first non-magnetic layer, in which a magnetization direction of the first pinned layer is not easily rotated in response to the external magnetic field. At least one of the first pinned layer and the free layer includes a first metal magnetic film contacting the first non-magnetic layer, and a first oxide magnetic film.

In one embodiment of this invention, the first pinned layer includes the first metal magnetic film and the first oxide magnetic film.

In one embodiment of this invention, the magnetoresistance effect element further includes a second non-magnetic layer provided on a side opposite to the first non-magnetic layer of the free layer; and a second pinned layer provided on a side opposite to the free layer of the second non-magnetic layer, in which a magnetization direction of the second pinned layer is not easily rotated in response to the external magnetic field.

In one embodiment of this invention, the free layer includes the first metal magnetic film and the first oxide magnetic film.

In one embodiment of this invention, a magnetoresistive effect element includes an oxide non-magnetic film provided on a side opposite to the first non-magnetic layer of the free layer, having satisfactory flatness.

In one embodiment of this invention, a magnetoresistance effect element further includes a pinning layer magnetically coupled to the first oxide magnetic film.

In one embodiment of this invention, the free layer further includes a second metal magnetic film provided on a side opposite to the first metal magnetic film of the first oxide magnetic film.

In one embodiment of this invention, a magnetoresistance effect element includes a pinning layer magnetically coupled to the first pinned layer.

In one embodiment of this invention, the first pinned layer further includes a second metal magnetic film provided on a side opposite to the first metal magnetic film of the first oxide magnetic film.

In one embodiment of this invention, the first pinned layer further includes a second metal magnetic film provided on a side opposite to the first metal magnetic film of the first oxide magnetic film; a third metal magnetic film; and an exchange-coupling non-magnetic film antiferromagnetically exchange-coupling the second and third metal magnetic films.

In one embodiment of this invention, the first pinned layer further includes a non-magnetic film provided on a side opposite to the first metal magnetic film of the first oxide magnetic film; and a second oxide magnetic film magnetically exchange-coupling the first oxide magnetic film via the non-magnetic films.

In one embodiment of this invention, the first oxide magnetic film contains Fe element.

In one embodiment of this invention, the first oxide magnetic film contains Fe and X element where X is at least one element selected from Al, Si, B, and N.

In one embodiment of this invention, the first oxide magnetic film contains $MFe_2O_4$ as a major component where M is at least one element selected from Fe, Co, and Ni.

In one embodiment of this invention, the first oxide magnetic film contains $Fe_3O_4$ as a major component.

In one embodiment of this invention, the first oxide magnetic film contains $CoFe_2O_4$ as a major component. p In one embodiment of this invention, the pinning layer contains P—Mn where P is at least one element selected from Pt, Ni, Pd, Ir, Rh, Ru, and Cr.

In one embodiment of this invention, the pinning layer contains $\alpha$-$Fe_2O_3$ or NiO or both, or includes an $\alpha$-$Fe_2O_3$ film and a NiO film.

In one embodiment of this invention, the pinning layer includes an $(AB)_2O_x$ layer where a ratio of the combination of element A and element B to oxygen is equal to 2:x; 2.8<x<32; and where t is defined as:

$$t=(Ra+Ro)/(\sqrt{2}\cdot(Rb+Ro))$$

(where Ra, Rb, and Ro denote the ion radii of the atoms A, B, and O, respectively)
and t satisfies 0.8<t<0.97.

In one embodiment of this invention, element B of the $(AB)_{2Ox}$ layer includes at least one transition metal, and has Fe as a major component.

In one embodiment of this invention, element A of the $(AB)_aO_x$ layer includes at least one element selected from rare earth metals.

In one embodiment of this invention, the first oxide magnetic film is an oxide of the first metal magnetic film.

In one embodiment of this invention, the first metal magnetic film includes a Co—Fe alloy.

In one embodiment of this invention, the free layer includes a non-magnetic film and two metal magnetic films which are antiferromagnetically exchange-coupled via the non-magnetic film; and the two films have different thicknesses or different levels of saturated magnetization.

In one embodiment of this invention, the magnetoresistance effect element further comprises electrodes provided on the upper and lower sides thereof; and a current flows vertically through the magnetoresistance effect element.

According to another aspect of the present invention, a magnetoresistance effect type head includes the above-described magnetoresistance effect element and a shield.

According to another aspect of the present invention, a magnetoresistance effect type head includes the magnetoresistance effect element; and a yoke for introducing a magnetic field into the magnetoresistive effect element.

According to another aspect of the present invention, a magnetic recording apparatus includes the magnetoresistance effect type head; a servo section for controlling the magnetoresistance effect type head to track a recording medium; and a signal processing section for processing a signal which the magnetoresistance effect type head records or reproduces onto or from the recording medium.

According to another aspect of the present invention, a magnetoresistance effect memory element includes the magnetoresistance effect element; an information reading lead line for reading information from the magnetoresistance effect element; and an information recording lead line for recording the information into the magnetoresistance effect element.

According to another aspect of the present invention, a method for producing the magnetoresistance effect element, includes a first step for forming the first oxide magnetic film via sputtering using an oxide target.

In one embodiment of this invention, the oxide target contains $Fe_3O_4$.

In one embodiment of this invention, the first step includes a second step for forming the first oxide magnetic film via sputtering using an inert gas and oxygen gas.

In one embodiment of this invention, the first step includes a second step for forming the first oxide magnetic film via sputtering using an inert gas and oxygen gas.

In one embodiment of this invention, the oxide target contains $CoFe_2O_4$.

According to another aspect of the present invention, a method for producing a magnetoresistance effect element, includes a first step for forming a free layer, a non-magnetic layer, and a metal magnetic film of a pinned layer successively directly on a substrate, or via a layer on the substrate; a second step for oxidizing a surface of the metal magnetic film of the pinned layer; a third step for forming an oxide magnetic film on a surface of the metal magnetic film; and a fourth step for forming a pinning layer on the oxide magnetic film. A magnetization direction of the free layer is easily rotated in response to an external magnetic field, and a magnetization direction of the pinned layer is not easily rotated in response to an external magnetic field.

In one embodiment of this invention, the second step includes plasma oxidization.

In one embodiment of this invention, the second step includes a step for oxidizing the surface of the metal magnetic film using oxygen radicals generated by an oxygen radical source.

In one embodiment of this invention, the second step includes natural oxidation.

In one embodiment of this invention, the second step includes a step for oxidizing the surface of the metal magnetic film using oxygen ions generated by an oxygen ion source.

According to another aspect of the present invention, a method for producing a magnetoresistance effect element, includes a first step for forming a free layer, a non-magnetic layer, and a first metal magnetic film of a pinned layer successively directly on a substrate, or via a layer on the substrate; a second step for forming an oxide magnetic film of the pinned layer; a third step for forming a second metal magnetic film on a surface of the oxide magnetic film via reactive sputtering; and a fourth step for forming a pinning layer on the second magnetic film. A magnetization direction of the free layer is easily rotated in response to an external magnetic field, and a magnetization direction of the pinned layer is not easily rotated in response to an external magnetic field.

Thus, the invention described herein makes possible the advantages of (1) providing the magnetoresistance effect element in which the pinned layer includes a multilayer film of the metal magnetic film and the oxide magnetic film, thereby obtaining a high MR ratio and in which the pinning layer is made of Pt—Mn, thereby obtaining thermal stability without losing the high MR ratio; and (2) providing the method for producing the magnetoresistance effect element.

These and other advantages of the present invention will become apparent to those skilled in the art upon reading and understanding the following detailed description with reference to the accompanying figures.

DESCRIPTION OF THE PREFERRED EMBODIMENT

Figure 1:
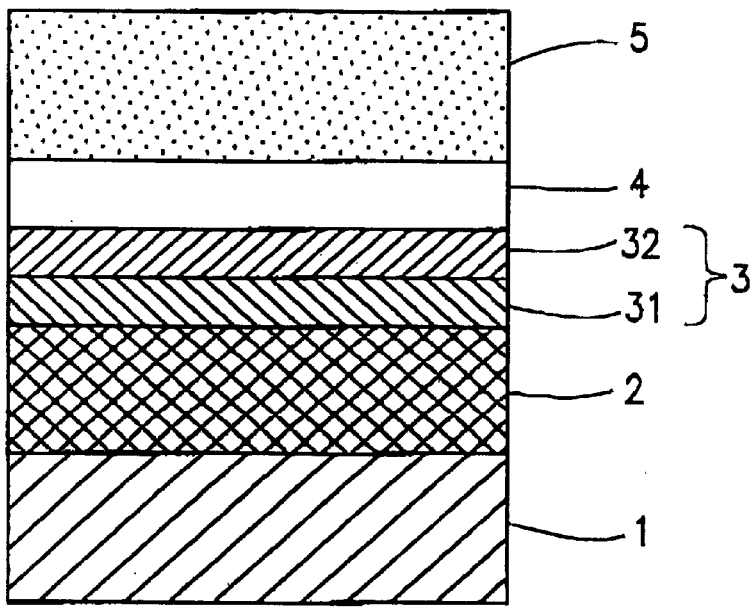
FIGS. 1–4, 5A–5B, 6–10, 11A–11B, and 12–13 are cross-sectional views of examples of magnetoresistance effect elements according to the present invention.

FIG. 1 is a cross-sectional view illustrating a spin valve film 100 according to an example of the present invention. The spin valve film 100 includes a magnetic film 5 (free layer), a non-magnetic layer 4, a pinned layer 3 having a metal magnetic film 32 and an oxide magnetic film 31, and a pinning layer 2 on a substrate 1. That is, the metal magnetic film 32 of the pinned layer 3 contacts the non-magnetic layer 4 while the oxide magnetic film 31 of the pinned layer contacts the pinning layer 2.

Figure 2:
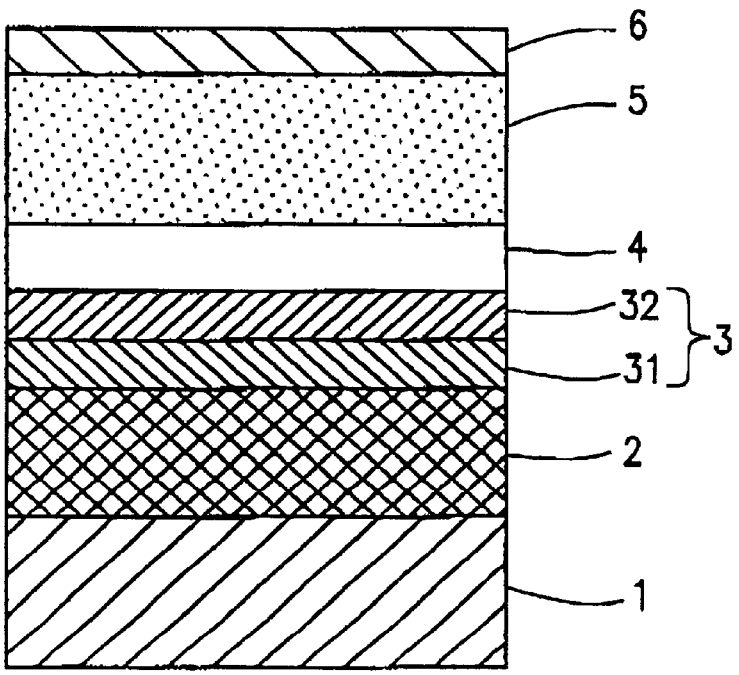

FIG. 2 is a cross-sectional view illustrating a spin valve film 200 according to another example of the present invention. As shown in FIG. 2, an oxide non-magnetic film 6 is disposed on a surface opposite to the non-magnetic layer 4 of the free layer 5. The interface between the free layer 5 and the oxide non-magnetic layer 6 should be flat.

Figure 3:
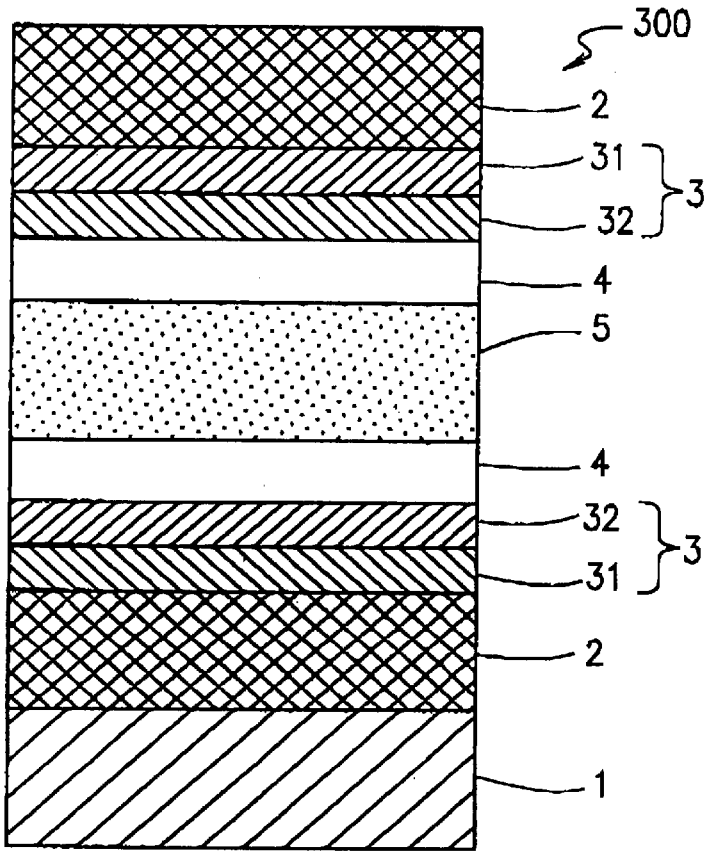

FIG. 3 is a cross-sectional view illustrating a spin valve film 300 according to still another example of the present invention. As shown in FIG. 3, the spin valve film 300 includes a pinning layer 2, a pinned layer 3 having a metal magnetic film 32 and an oxide magnetic film 31, an upper non-magnetic layer 4, a magnetic film 5 (free layer), a lower non-magnetic layer 4, a pinned layer 3 having a metal magnetic film 32 and an oxide magnetic film 31, and a pinning layer 2 on a substrate 1.

Figure 5A:
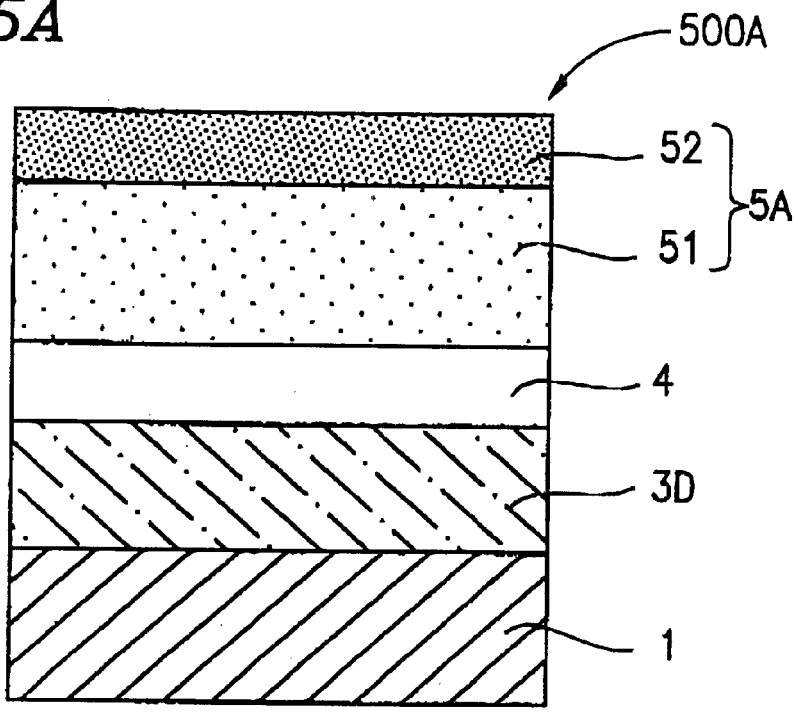

FIG. 5A is a cross-sectional view illustrating a spin valve film 500 according to still another example of the present invention. As shown in FIG. 5, a free layer 5A includes a metal magnetic film 51 and an oxide magnetic film 52. The metal magnetic film 51 contacts a non-magnetic layer 4. A pinned layer 3D includes a metal magnetic layer and an oxide magnetic film.

Figure 6:
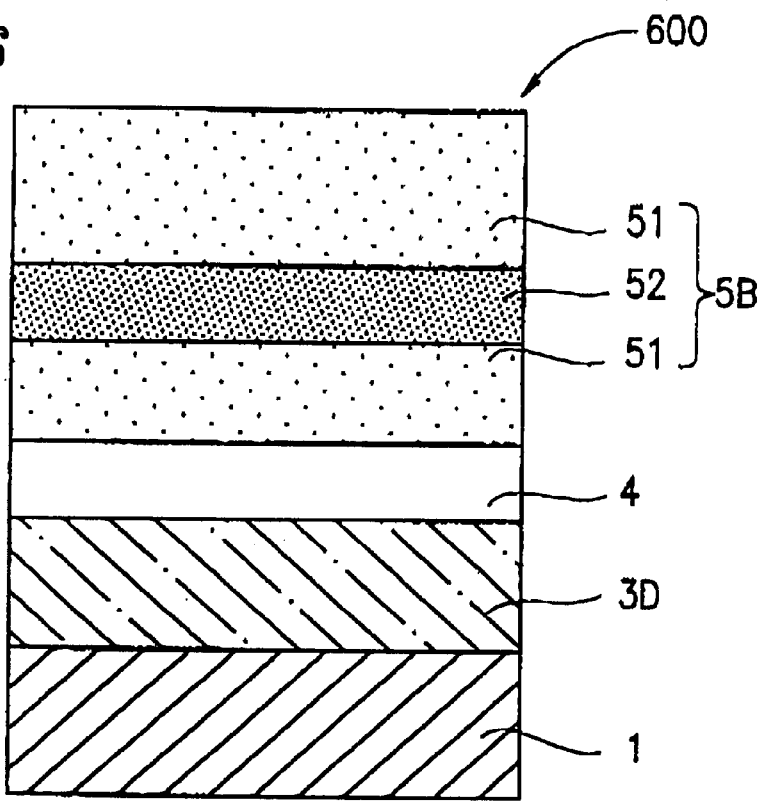

In particular, a free layer 5B may include a metal magnetic film 51, an oxide magnetic film 52, and a metal magnetic film 51 as shown in FIG. 6.

Figure 7:
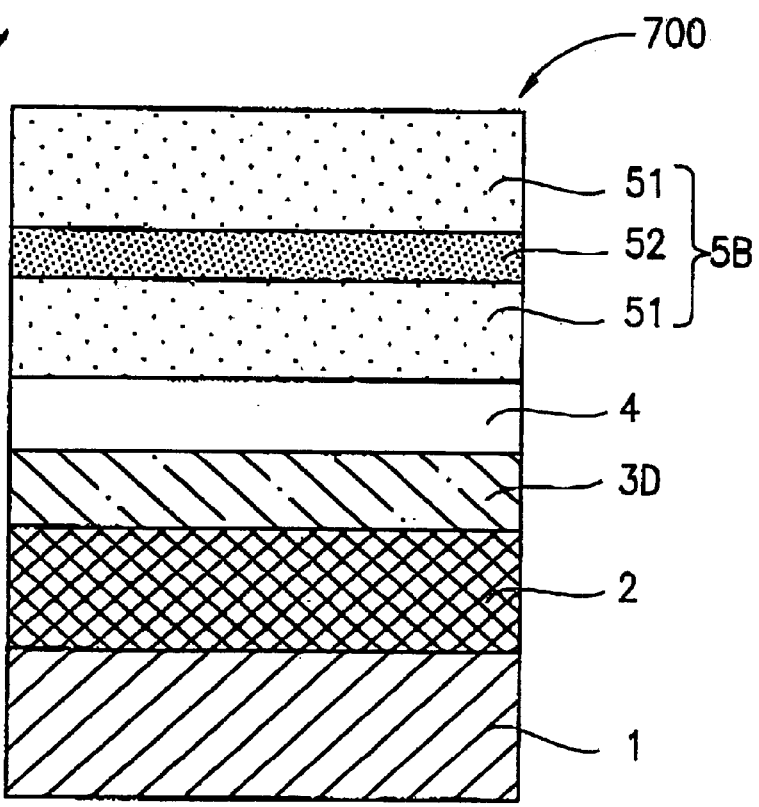

As shown in FIG. 7, a pinning layer 2 may be provided to contact a pinned layer 3D as shown FIGS. 5A and 6. The pinned layer 3D shown in FIG. 7 may have a structure similar to that shown in FIG. 1, 2 or 4 described hereinafter. The pinned layer 3D may include a metal magnetic film 31, an oxide magnetic film 32, and a metal magnetic film 31 as shown in FIG. 8.

Figure 8:
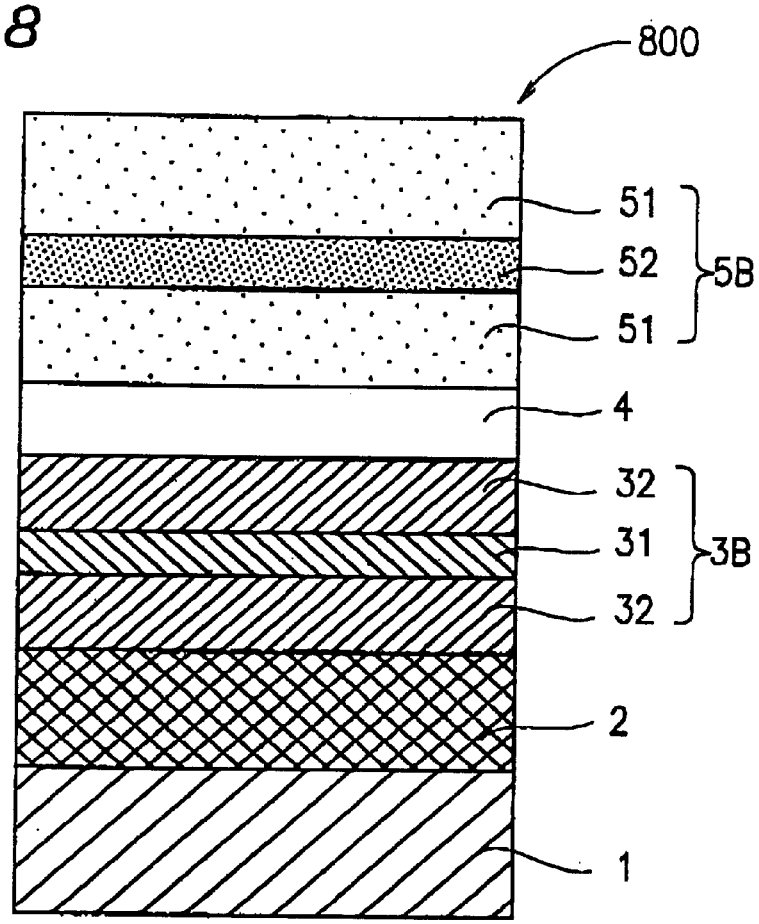

The free layer 5B shown in FIGS. 7 and 8 may has a structure as shown in FIG. 5A.

Preferably, the above-described oxide magnetic films contain Fe. For example, Fe—X (X is about 4 to 30% in atomic percentage) which contains both Fe and elements X has both soft magnetic characteristics and high resistance. Note that X is at least one element selected from Al, Si, B, and N. To form such films, Fe—Al, Fe—Si, Fe—B, or the like is used as a target, and reactive sputtering is performed using oxygen in nitrogen. This allows formation of FeAlO, FeSiO, FeBO, FeAlON, FeSiON, FeBON, FeAlSiO, FeAlSiON, or the like. Fe—X has a lower resistance than $MFe_2O_4$ described below but has advantage such that the resistance can be adjusted by changing conditions for film formation or the composition thereof.

Preferably, the above-described oxide magnetic films contain $MFe_2O_4$ (M is at least one kind of element selected from the group consisting of Fe, Co, and Ni) as a major component.

When $Fe_3O_4$ is used as a major component of the oxide magnetic films, the films have a higher resistance than that contains Fe—X. The resistance is further increased when $CoFe_2O_4$ is used as the major component. This $CoFe_2O_4$ oxide magnetic film is suitably used as part of the pinned layer which needs to exhibit the hard magnetic characteristic.

Preferably, the above-described pinning layers are made of a P—Mn alloy (P is at least one element selected from Pt, Ni, Pd, Ir, Rh, Ru, and Cr). The pinning layers may include either an $\alpha$-$Fe_2O_3$ film or a Nio film or both. The pinning layers may include $(AB)_2O_x$ where the ratio of the combination of element A and element B to oxygen is equal to 2:x; 2.8<x<3.2; and where t is defined by:

$$t=(Ra+Ro)/(\sqrt{2}\cdot(Rb+Ro))$$

(where Ra, Rb, and Ro denote the ion radii of the atoms A, B, and O, respectively)

and ti satisfies 0.8<t<0.97.

Preferably, element B of $(AB)_2O_x$ is at least one transition metals, including Fe as a major component. The element A is preferably at least one element selected from the group of rare earth elements (including Y and La).

These films are formed on the substrate by sputtering. When the pinning layer is in a lower position as shown in FIG. 1, the pinning layer preferably includes the $\alpha$-$Fe_2O_3$ film, the NiO film, or the $(AB)_2O_x$ film. When the pinning layer is in an upper position in a structure in which the layers are disposed in a reverse order. P—Mn is preferable for the pinning layer. Pt—Mn can be used in the former case.

As the pinning layer, the same applies to the MR element 200 shown in FIG. 2. In FIG. 3, the upper and lower pinning layers 2 may be made of appropriate but different materials.

Figure 4:
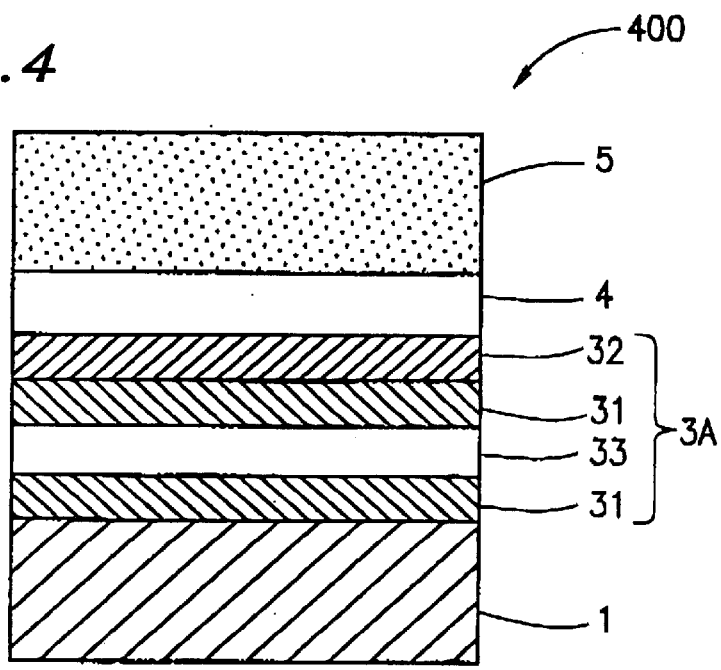

As shown in FIG. 4, the pinned layer 3A may include a metal magnetic film 32 which contains the non-magnetic film 4, and a multi-layer film in which two oxide magnetic films 31 are magnetically exchange-coupled with each other via a non-magnetic film 33.

Furthermore, the structures shown in FIGS. 1, 2, 4, 5A, and/or 8 may be combined to provides the structures shown in FIGS. 9 to 13.

Figure 9:
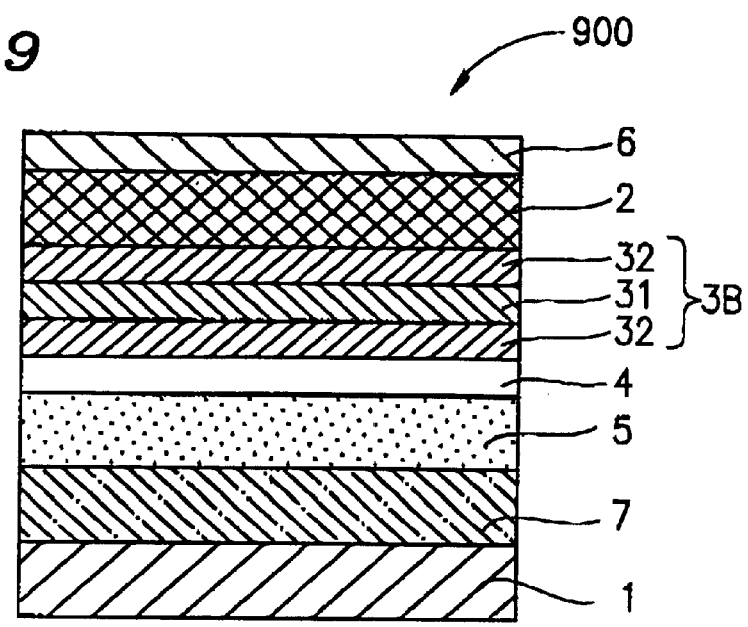

The structure shown in FIG. 9 has the same layers as those in FIG. 8 but in the reverse order. In FIG. 9, a free layer 5 is a single layer as in FIG. 1 to 3, but underneath has a layer 7 for improving the soft magnetic characteristic of the free layer 5.

Figure 10:
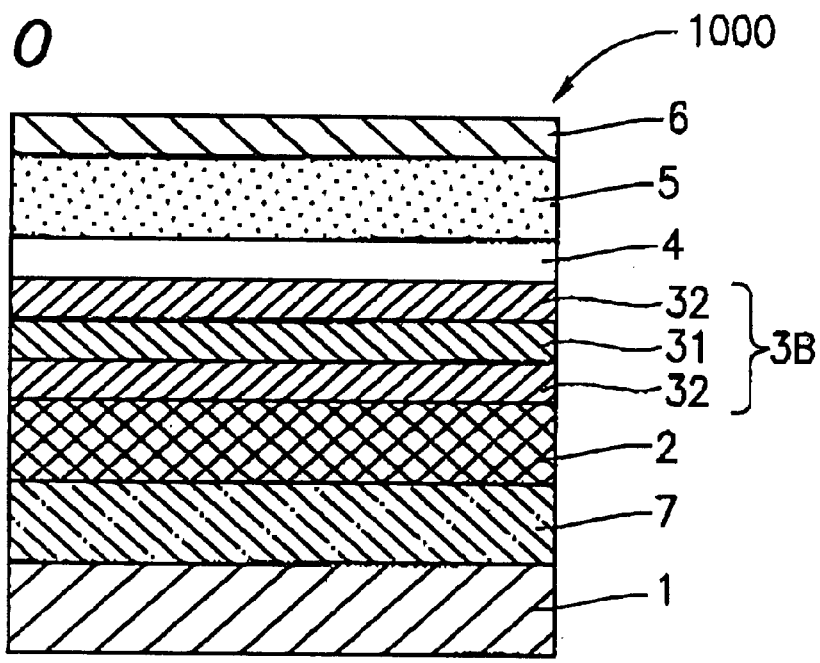

The structure shown in FIG. 10 has the structure shown in FIG. 8 as a basic structure. In FIG. 10, a free layer 5 is a single layer. An oxide non-magnetic film 6 is provided on the free layer 5. Further, a layer 7 is provided for improving the characteristics of a pinning layer 2.

Figure 11A:
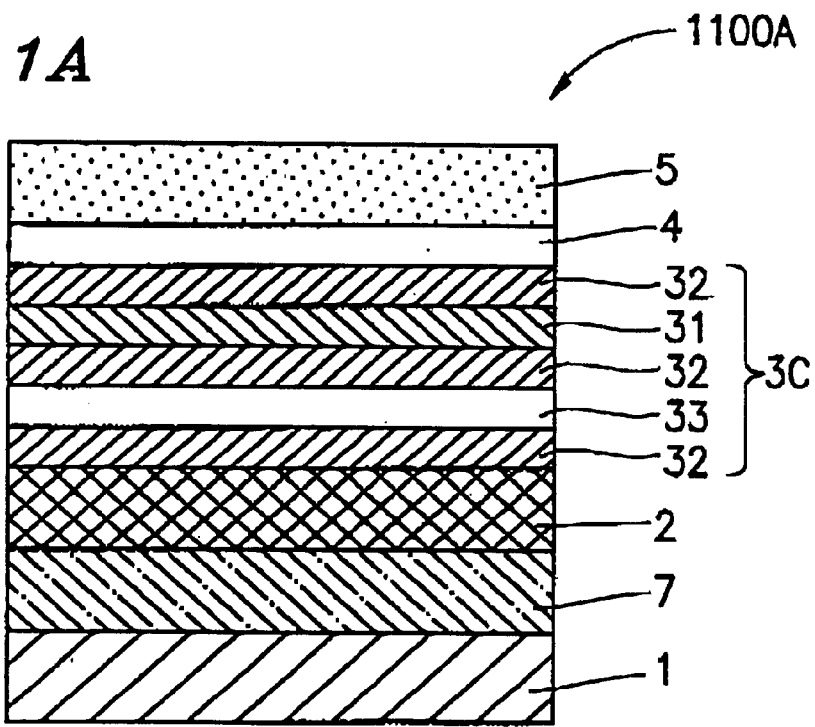

In FIG. 11A, a magnetoresistance effect element 1100A according to the present invention has a structure based on the element 1000 shown in FIG. 10. In the element 1100A, a pinned layer 3C includes an upper metal magnetic film 32, a non-magnetic film 33, a middle metal magnetic film 32, an oxide magnetic film 31, and a lower metal magnetic film 32. As shown in FIG. 11A, the middle and lower metal magnetic films 32 are magnetically exchange-coupled via the non-magnetic film 33 similar to the pinned layer 3A in FIG. 4. However, the metal magnetic films 32 are used unlike FIG. 4. The lower metal magnetic film 32 contacts a pinning layer 2. The non-magnetic film 33 may have a thickness such that the exchange coupling becomes anti-ferromagnetic. The anti-ferromagnetic exchange coupling results in an enhanced pinning effect of the pinning layer 2. In the element 1100A, an oxide non-magnetic film 6 is not provided on the free layer 5 unlike FIG. 10, but an oxide film or a metal protection film may be provided on the free layer 5.

A current is typically allowed to flow in a plane of a film in the above-described MR elements. Since the MR elements have the oxide magnetic layer, it is possible to provide electrodes on the upper and lower sides of the element so that a current flows vertically through the film.

Figure 14A:
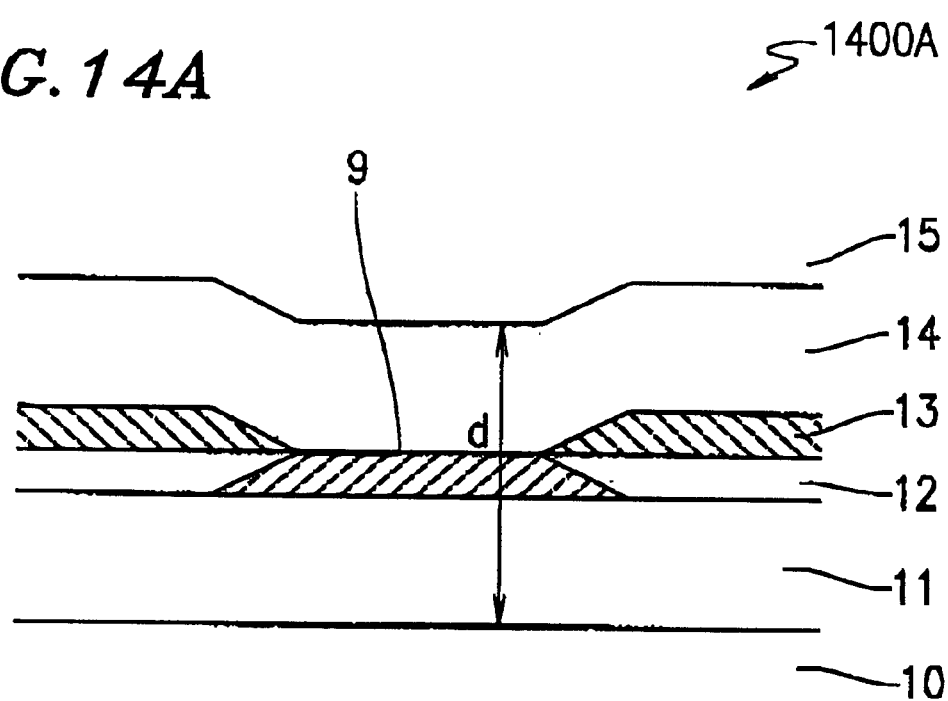
FIGS. 14A and 14B are diagrams illustrating examples of a magnetoresistance effect head of the present invention.
Figure 14B:
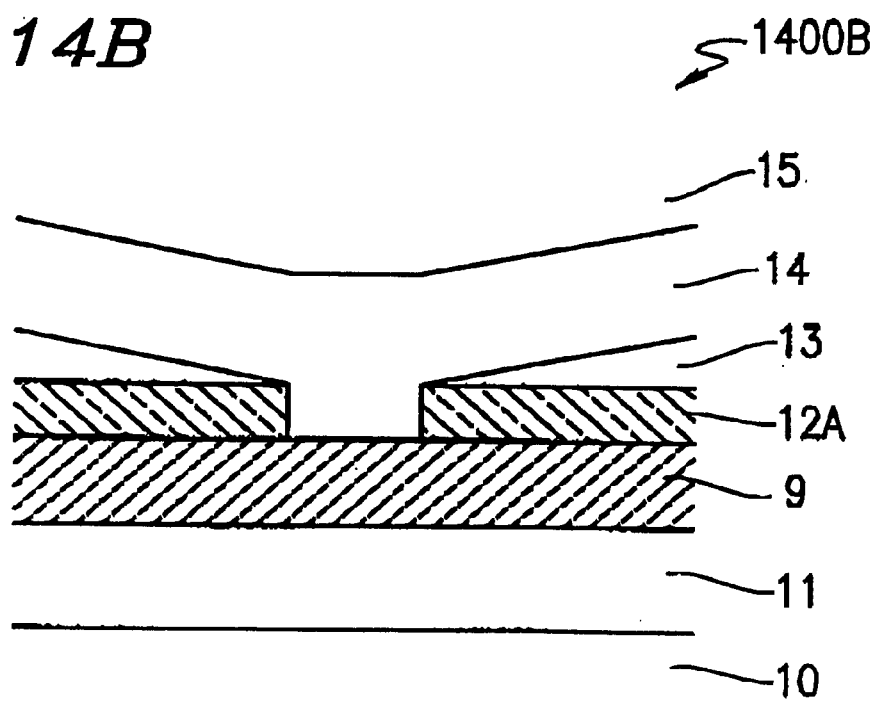
Figure 15:
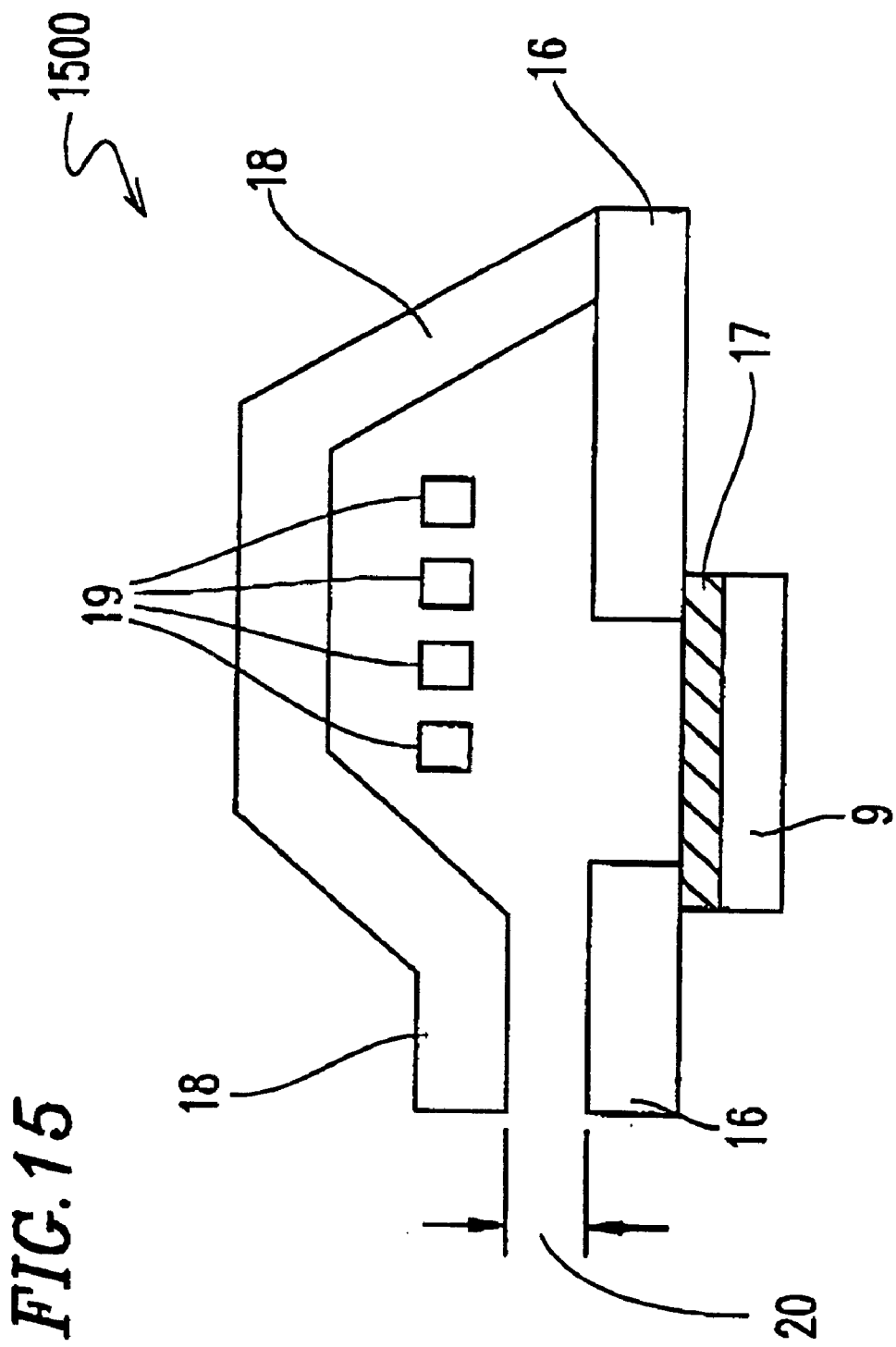
FIG. 15 is a diagram illustrating an example of a yoke type magnetoresistance effect head according to the present invention.

Two kinds of magnetoresistance effect type heads according to the present invention are shown in FIGS. 14A, 14B, and 15. One MR head (FIGS. 14A and 14B) includes the MR element 9 and shields 10 and 15. The other MR head (FIG. 15) includes the MR element 9 and a yoke 16 of a soft magnetic body which introduces a magnetic field to be detected into the MR element 9. The MR head shown in FIG. 14A includes a hard bias portion 12. The MR head shown in FIG. 14B includes an antiferromagnetic bias portion 12A.

In FIGS. 14A and 14B, a current is allowed to flow in a plane of a film in the MR element 9. When a load portion 13 is attached to the upper and lower surfaces of the film of the MR element 9 and an upper shield 15 and a lower shield 10 are connected to each other, a current flows vertically through the MR element. Such a structure has advantage of providing a narrow gap. In this case, a hard bias portion 12 should be isolated from the MR element 9, or the hard bias portion 12 should be made of insulator.

Figure 16:
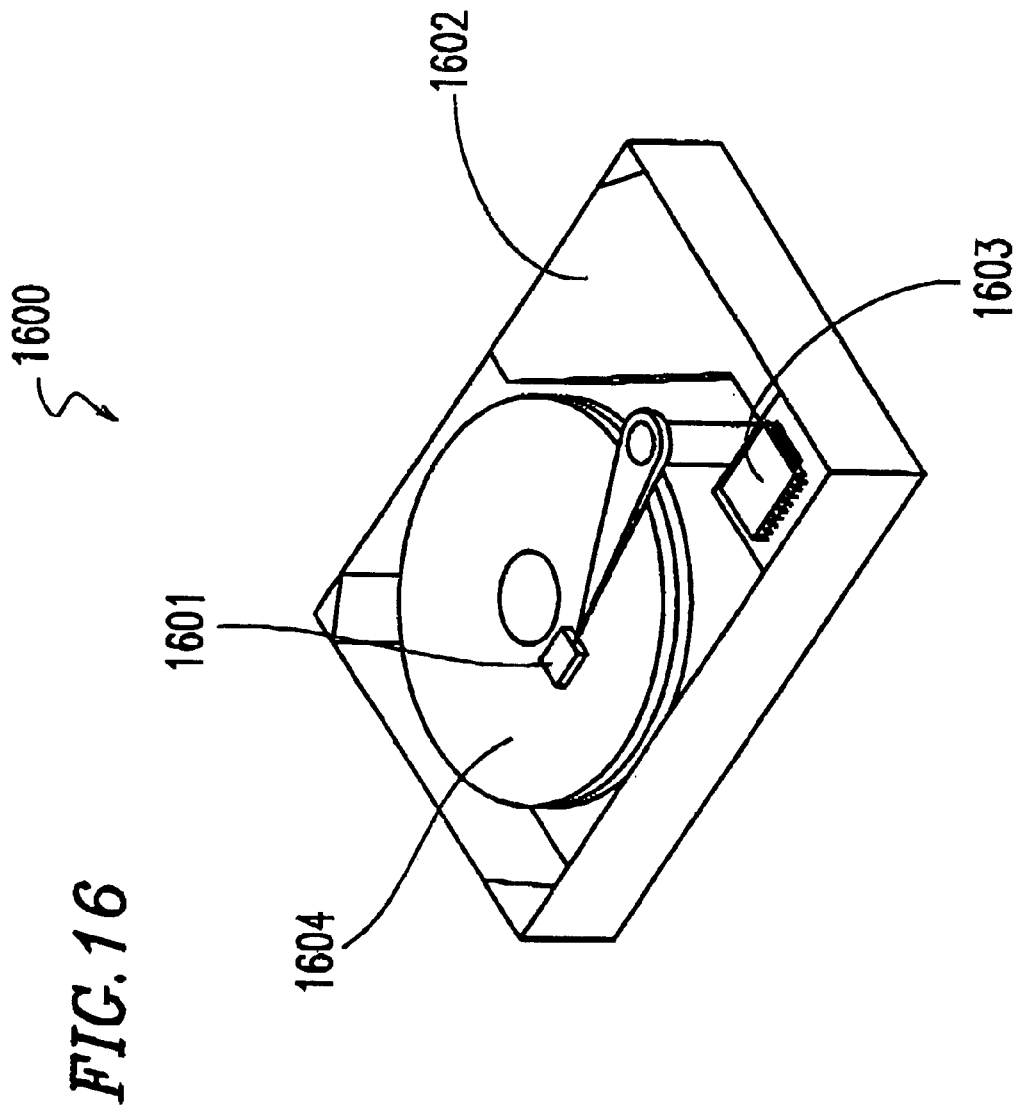
FIG. 16 is a diagram illustrating a magnetic recording apparatus according to the present invention.

FIG. 16 shows a configuration of a magnetic recording apparatus 1600 including one of the above-described MR heads. The disk recording apparatus 1600 includes a disk 1604 into which information is recorded, a magnetic head section 1604 for recording or reproducing the information onto or from the disk 1604, a signal processing section 1603, and a servo section 1602 for tracking the disk 1604 using the head section 1601. This disk recording apparatus can record information onto the disk 1604 in high density.

Figure 17:
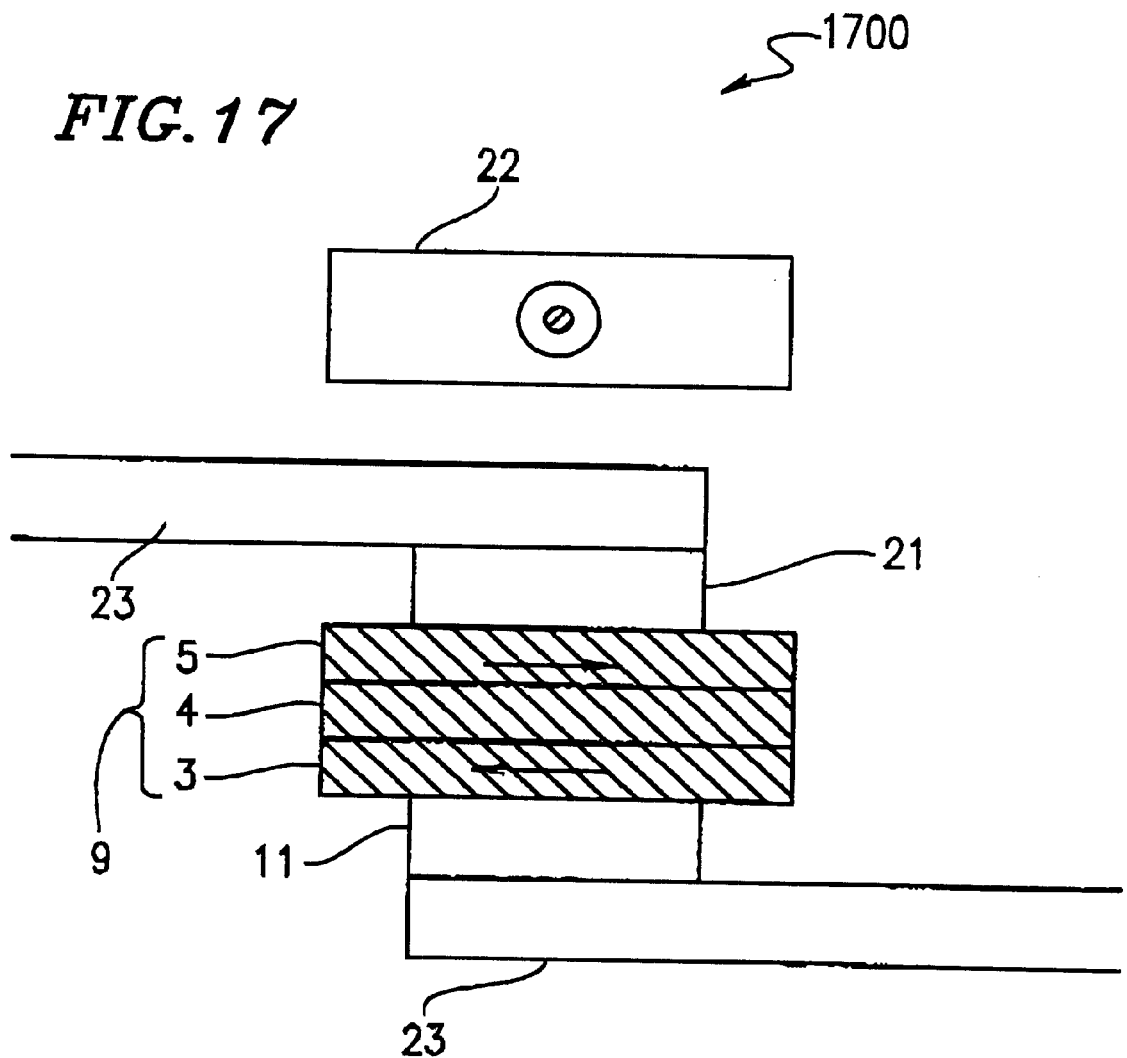
FIG. 17 is a diagram illustrating an example of a magnetoresistance memory element according to the present invention.

Furthermore, when a sense line 23 for reading information and a word line 22 for writing information are provided with the above-described MR elements, a magnetoresistance effect memory element 1700 as shown in FIG. 17 can be constructed. When the memory elements 1700 are arranged in a matrix, a so-called magnetoresistance random access memory (MRAM) can be constructed.

A magnetoresistance effect element, a magnetoresistance effect type head, and a magnetoresistance memory element will be described below with reference to the accompanying drawings.

FIG. 1 is a cross-sectional view illustrating a configuration of a magnetoresistance effect element 100 according to an example of the present invention. In FIG. 1, on the substrate 1, a pinning layer 2, a pinned layer 3 (oxide magnetic film 31/metal magnetic film 32), a non-magnetic layer 4, and a free layer 5 are successively provided. The magnetization of the oxide magnetic film 31 is pinned by an exchange bias magnetic field of the pinning layer 2. The oxide magnetic film 31 and the metal magnetic film 32 are ferromagnetically coupled, so that the magnetization of the metal magnetic film 32 is pinned to direct toward the same magnetization direction of the oxide magnetic film 31. The magnetic free layer 5 is magnetically separated via the non-magnetic layer 4 from the pinned layer 3. This allows electrons to move relatively freely due to an external magnetic field. In general, when the two magnetic layers 3 and 5 have anti-parallel magnetization directions, electrons are scattered at the interface between the magnetic layer 5 and the non-magnetic layer 4, so that the element resistance is increased.

On the other hand, when the magnetization directions of the two magnetic layers are the same, the magnitude of the electron scatter is small so that the element resistance is decreased. Therefore, the electric resistance of the element varies depending on the angle between the magnetization directions of the pinned layer 3 and the free layer 5. When the element is used as a magnetoresistance sensor, an electrode is attached to the free layer 5 and a current is applied via the electrode to the free layer 5. An external magnetic field causes a change in resistance, which can be detected as an electric signal. The order of the multilayer structure provided on the substrate 1 may be reversed. In such a case, the pinning layer 2 and the oxide magnetic film 31 need to be partially removed so that the electrode can contact the metal magnetic film 32. When the pinned layer 3 has a hard magnetic film having a great coercive force such that the magnetization direction of the pinned layer 3 is not easily rotated, the pinning layer 2 is unnecessary.

For example, when the oxide magnetic film 31 is a hard magnetic film having a great coercive force, the metal magnetic film 32 is magnetically coupled with the oxide magnetic film 31. This causes the magnetization direction of the layer 3 to be pinned without the pinning layer 2.

The major factor of determining the magnetoresistance is the interface between a magnetic layer and a non-magnetic layer. When the magnetic layer is made of metal film, the increased thickness of the magnetic layer results in an decrease in the resistance of the whole element (hereinafter referred to as R) and $\Delta R$ (variation in the resistance) due to the shunting effect. In view of this, the pinned layer 3 includes not only the metal film for providing a metal-to-metal interface with the non-magnetic layer 4, but also the oxide film, thereby preventing an decrease in R and $\Delta R$. Accordingly, the resistance R of the whole element can be increased. The output of the element is proportional to $\Delta R$ multiplied by a current I in the element, i.e., $I \times \Delta R$. Accordingly, the output can be improved. On the other hand, when the pinned layer 3 does not includes the oxide magnetic film 31, the resistance R of the element 100 is small. In particular, a metal pinning layer 2 would decrease R significantly, so that the output of the element 100 is decreased even when the MR ratio $\Delta R/R$ is constant. Preferably, the interface between the oxide magnetic film 31 and the metal magnetic film 32 has an interface having a flatness such that the height of pits and protrusions is about 0.5 nm or less. Poor flatness leads to an increase in the resistance R even when the magnetization directions of the magnetic layer and the non-magnetic layer are parallel to each other, thereby reducing the MR ratio.

In general, a pinning layer made of oxide film has a greater MR ratio then that made of material film. However, the pinning effect is weak when a magnetic film (pinned layer) to be pinned is made of metal film. Such a problem is solved by the pinned layer including the oxide magnetic film which contacts the pinning layer.

FIG. 2 is a cross-sectional view illustrating a magnetoresistance effect element 200 according to another example of the present invention. As shown in FIG. 2, an oxide non-magnetic film 6 having good flatness is provided on the free layer so that electrons are mirror-reflected on the upper surface of the free layer 5. This causes a decrease in the resistance R, thereby obtaining a high MR ratio. Again, preferably, the interface between the oxide non-magnetic film 6 and the free layer 5 has an interface having a flatness such that the height of pits and protrusions is about 0.5 nm or less. If not, the amount of electrons reflected is not sufficient.

An oxide magnetic film may be used as the film 6 when the magnetic film has a good flatness and does not degrade the soft magnetic characteristics of the free layer 5. Furthermore, a metal reflection film or an Ag/Au film which mirror-reflects electrons may be provided on the free layer 5. However, an overthick mirror reflection film causes the MR ratio to decrease due to a shunting effect. The thickness of the mirror reflection is preferably about 10 nm or less, more preferably about 3 nm or less.

Preferably, the interface between the metal mirror reflection film and the free layer 5 has a flatness such that the height of pits and protrusions is about 0.5 nm or less. If not, the amount of reflection is not sufficient. The above-described oxide non-magnetic film may be provided on the metal reflection film.

The order of the above-described multilayer structure provided on the substrate 1 may be reversed. In such a case, the pinning layer 2 and the oxide magnetic film 31 need to be partially removed so that the electrode can contact the metal magnetic film 32.

FIG. 3 is a cross-sectional view illustrating a magnetoresistance effect element 300 having a dual spin valve structure according to the present invention. The element 300 is characterized by a higher MR ratio than that of the element 100 shown in FIG. 1 since the interface between a magnetic layer and a non-magnetic layer has an increased area in which electrons are magnetically scattered. The conventional magnetoresistance effect element does not have the oxide magnetic film 31, the resistance R of the whole element is decreased but ΔR is just slightly increased so that the output is not significantly improved. In the structure shown in FIG. 3, a current flows between the two oxide magnetic film 31 so that R is not much decreased and the MR ratio is increased, resulting in a large output. In this case, an upper pinning layer 2 and an upper oxide magnetic film 31 need to be partially removed so that an electrode contacts an upper metal magnetic layer 32.

FIG. 4 is a cross-sectional view illustrating a magnetoresistance effect element 400 according to the present invention. The element 400 includes a pinned layer 3A including a metal magnetic film 32 which contacts a non-magnetic film 4 and a multilayer in which a non-magnetic film 33 is interposed between two oxide magnetic films 31 exchange-coupled magnetically. In FIG. 4, the oxide magnetic films 31 are magnetically exchange-coupled via the mon-magnetic film 33 so that the magnetization direction of the oxide magnetic films 31 are not easily rotated by an external magnetic field. The multilayer is magnetically coupled with the metal magnetic film 32 to construct the pinned layer 3A.

A metal magnetic film may be provided between the non-magnetic film 33 and the two oxide magnetic films 31 so as to enhance the exchange coupling between the oxide magnetic film 31.

A pinning layer (not shown) may be provided between the lower oxide magnetic film 31 and the substrate 1 as in FIGS. 1 to 3.

Furthermore, the free layer 5 may contain an oxide magnetic film as shown in FIGS. 5 to 8.

Figure 5B:
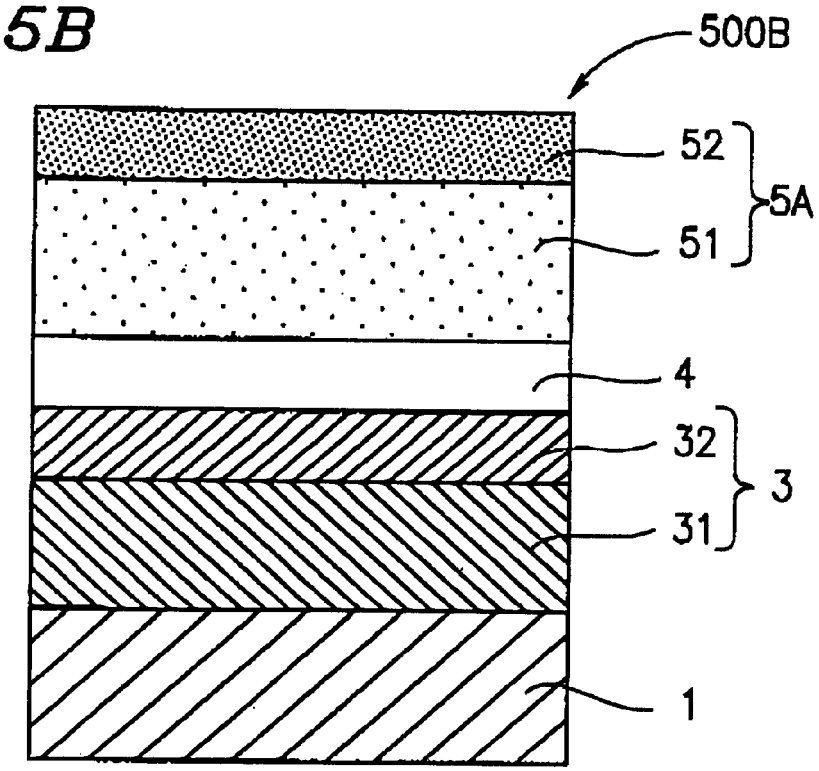

FIG. 5A is a cross-sectional view illustrating a magnetoresistance effect element 500A according to the present invention. In FIG. 5, a free layer 5A includes a metal magnetic film 51 which contacts a non-magnetic layer 4, and an oxide magnetic layer 52. The element 500A has a higher MR ratio than when the free layer 5 is formed only of metal magnetic film, reducing the total thickness of all the metal portions of the element 500A. The oxide magnetic film 52 is preferably soft magnetic. In FIG. 5, The pinned layer 3 is indicated as a single film, but may include a metal magnetic film 32 and an oxide magnetic film 31 as shown in FIG. 5B.

FIG. 6 is a cross-sectional view illustrating a magnetoresistance effective element 600 according to the present invention. In the element 600, an oxide magnetic film 52 has a thickness of about 2 nm or less. In this case, the soft magnetic characteristic of the oxide magnetic film 52 substantially is not required unlike that shown in FIG. 5.

In the above-described elements 500A, 500B, and 600, the oxide magnetic film 52 preferably has a high level of resistance.

FIG. 7 is a cross-sectional view illustrating a magnetoresistance effect element 700 according to the present invention. In the element 700, a pinned layer 3D is pinned by a pinning layer 2. The MR ratio is higher when the pinning layer 2 is made of oxide film than when made of metal film.

FIG. 8 is a cross-sectional view illustrating a magnetoresistance effect element 800 according to the present invention. In the element 800, a pinned layer 3B includes an upper metal magnetic film 32, an oxide magnetic film 31, and a lower metal magnetic film 32. In this case, the higher the resistance of the oxide magnetic film 31 of the pinned layer 3B is, the higher the MR ratio is.

FIG. 9 is a cross-sectional view illustrating a magnetoresistance effect element 900 according to the present invention. The element 900 has the same multilayer structure on a substrate 1 as that of the element 800, except that the order of the layers is reversed and a free layer 5 is a single layer similar to FIGS. 1 to 3 and a layer 7 for enhancing the soft magnetic characteristic of the free layer 5 is provided under the free layer 5.

FIG. 10 is a cross-sectional view illustrating a magnetoresistance effect element 1000 according to the present invention. The element 1000 has a structure based on the element 800. In the element 1000, a free layer 5 is a single layer and an oxide non-magnetic film 6 is provided on the free layer 5. A layer 7 for enhancing the soft magnetic characteristic of a pinning layer 2 is provided under the pinning layer 2. The MR ratio is increased by providing a flat interface between the oxide non-magnetic film 6 and the free layer 5.

FIG. 11A is a cross-sectional view illustrating a magnetoresistance effect element 1100A according to the present invention. The element 1100A has a structure based on the element 1000. In the element 1100A, a pinned layer 3C includes an upper metal magnetic film 32, a non-magnetic film 33, a middle metal magnetic film 32, an oxide magnetic film 31, and a lower metal magnetic film 32. As shown in FIG. 11A, the two lower metal magnetic films 32 are magnetically exchange-coupled via the non-magnetic film 33 similar to the pinned layer 3A in FIG. 4. However, the metal magnetic films 32 are used in a different manner from that of FIG. 4. The lower metal magnetic film 32 contacts a pinning layer 2. The non-magnetic film 33 may have a thickness such that the exchange coupling becomes anti-ferromagnetic (e.g., if made of Ru, the thickness is about 0.6 to 0.8 nm). The anti-ferromagnetic exchange coupling results in an enhanced pinning effect of the pinning layer 2.

When the magnetoresistance effect element 1100A is used in a spin valve head, the anti-ferromagnetic exchange coupling can decrease a bias magnetic field which is caused by the pinned layer 3 and is applied to the free layer 5. In the element 1100A, an oxide non-magnetic film 6 is not provided on the free layer 5 unlike FIG. 10, but an oxide film or a metal protection film may be provided on the free layer 5.

Figure 12:
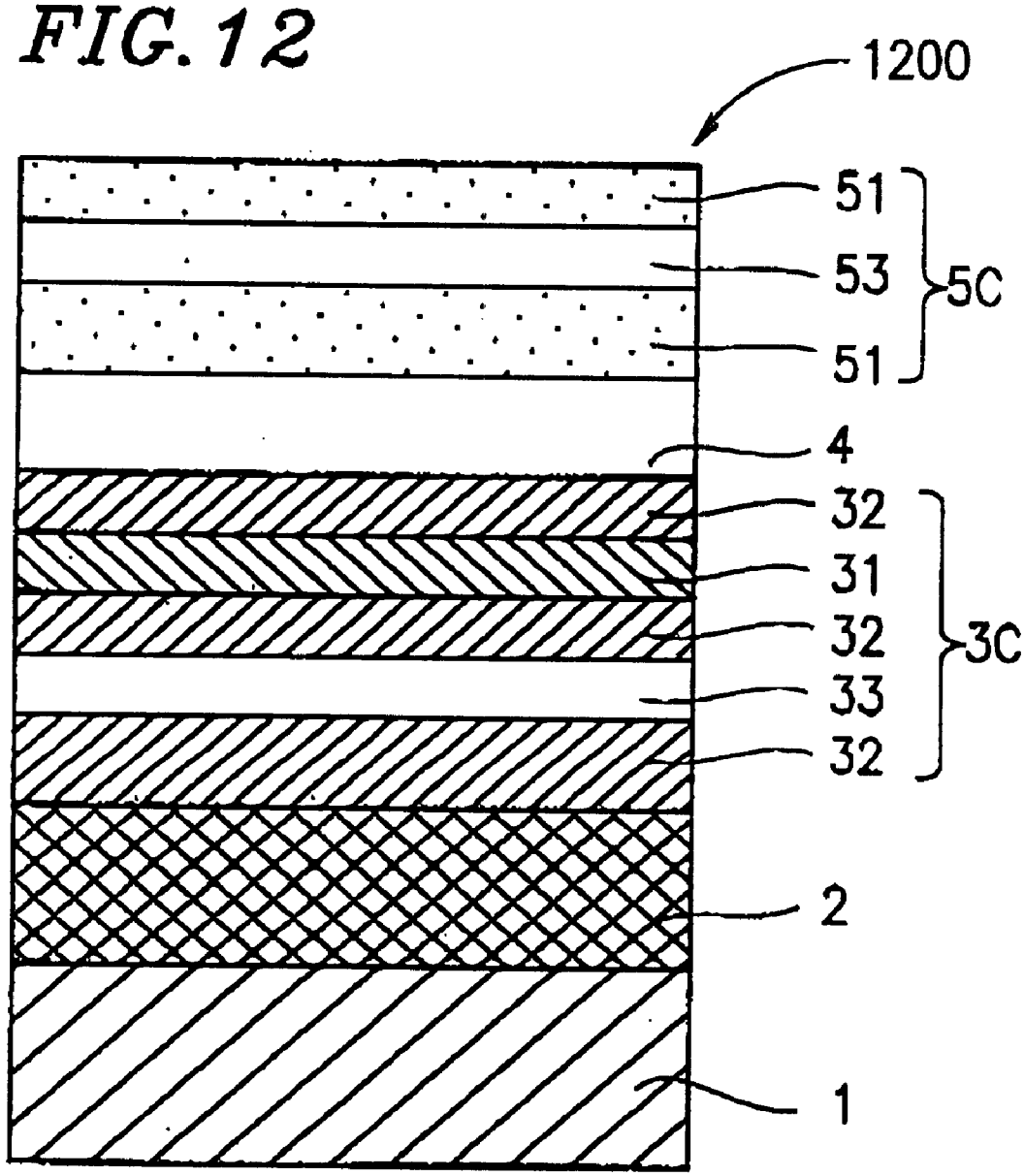

FIG. 12 is a cross-sectional view illustrating a magnetoresistance effect element 1200 according to the present invention. In the element 1200, a free layer 5C includes a non-magnetic film 53 interposed between two metal ferromagnetic films 51. The two films 51 have different thicknesses or different levels of saturated magnetization. The two ferromagnetic films 51 are in anti-parallel to each other, interposing the non-magnetic film 53. This results in a small diamagnetic field coefficient of the whole free layer 5C, i.e., a small value of Ms1*d1−Ms2*d2 where d1 and d2 are the thicknesses of the films 51 and Ms1 and Ms2 are the levels of saturated magnetization of the films 51. In general, an element having a small width has a great diamagnetic field coefficient. When such an element is a magnetoresistance effect element or head, the sensitivity of the element is decreased. When the element is a memory element, a current in a word line is increased in reversing a magnetization direction. These problems are solved by the present invention.

Figure 13:
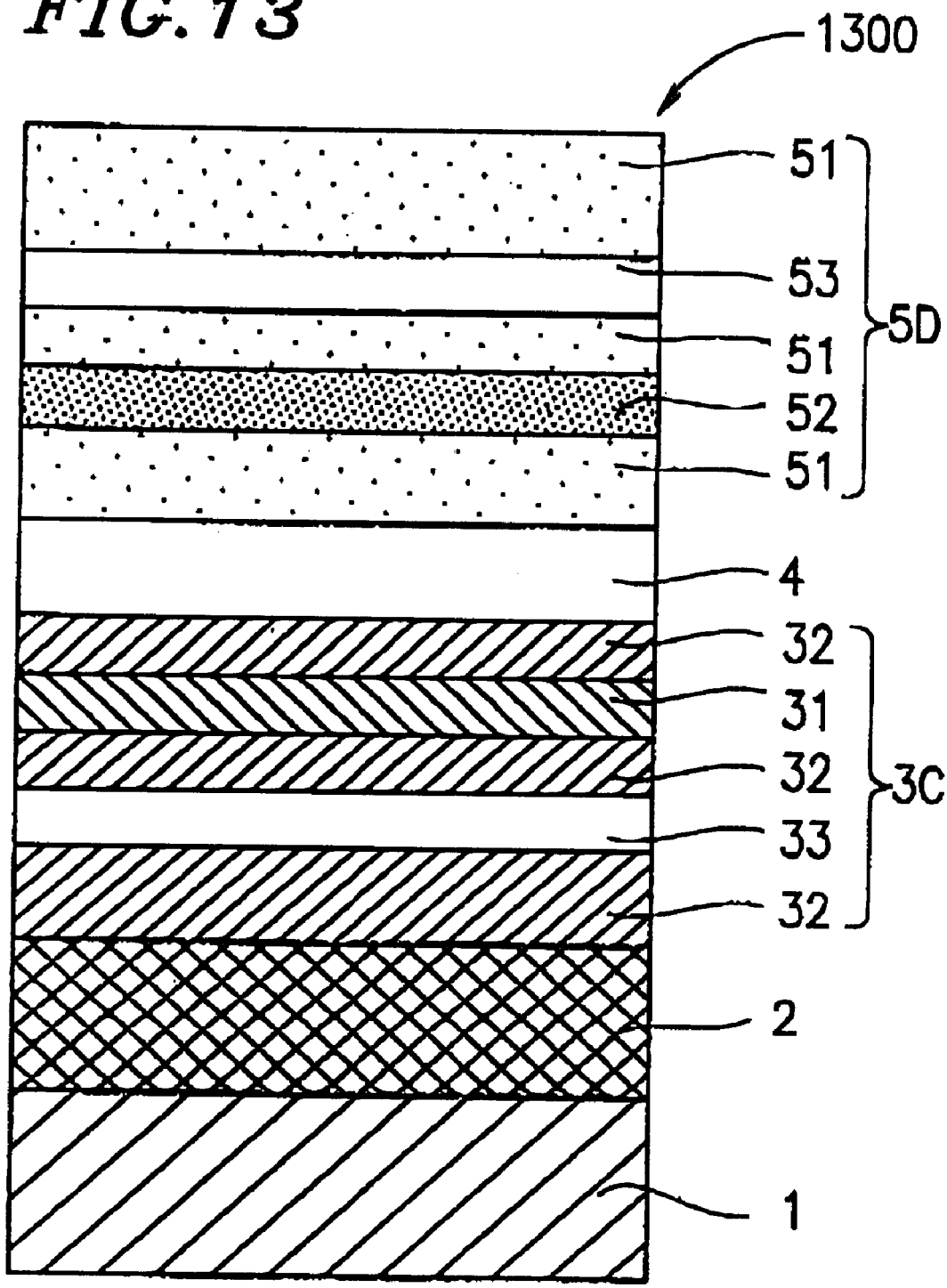

FIG. 13 is a cross-sectional view illustrating a magnetoresistance effect element 1300 according to the present invention. The element 1300 has a structures based on that shown in FIGS. 6 and 12. In the element 1300, a free layer 5D includes an oxide magnetic film 52 interposed between two layer metal magnetic films 51 so as to obtain a much higher MR ratio.

A metal film as the pinning layer 2 is made of irregular alloys Ir-Mn, Rh-Mn, Ru-Mn, and Cr-Pt-Mn. Such a metal film can be exchange-coupled with a magnetic film by simply forming the metal film in an magnetic field. When these films are applied to the elements shown in FIG. 1 or 2, the layers of the elements are preferably reversed. In FIG. 3, these films are preferably applied to the upper pinning layer 2. On the other hand, regular alloys such as Ni-Mn and Pt-(Pd)-Mn need thermal treatment for regulation but have excellent thermal stability. In general, when these alloys are applied to an MR element, the order of layers should be reversed in FIGS. 1 and 2, and in FIG. 3, these alloys should be used in the upper pinning layer 2. A film made of Pt-Mn can be used as either the upper or lower pinning layer 2 and the pinning effect thereof is great. Furthermore, the Pt-Mn is thermally stable. However, these metal films have disadvantage such that an element having a pinning layer 2 made of these metal film cannot have a high MR ratio. According to the present invention, it is possible to overcome the disadvantage and thus obtain a high MR ratio in spite of using these metal films.

An oxide film as the pinning layer 2 is made of $(AB)_2O_x$, NiO, $\alpha\text{-}Fe_2O_3$, or the like. The use of these oxide films lead to a high MR ratio. NiO is less thermally stable and is preferably in combination with $\alpha\text{-}Fe_2O_3$. An $(AB)_2O_x$ film has good thermal resistance, but requires heating a substrate during formation of the film on the substrate. The A atom of $(AB)_2O_x$ is an element having a large ionic radius, preferably rare earth elements such as La, Pr, Nd, Sm, Y or the like. The B atom of $(AB)_2O_x$, is an element having a small ionic radius, preferably at least one transition metal, particularly Fe for use in a pinning layer. Fe maintains the pinning effect up to high temperature.

An Ni-Co-Fe alloy is suitable for the free layers 5 of the above-described magnetoresistance effect elements. Preferably, molar fractions x, y, z of Ni, Co, Fe in the $Ni_xCo_yFe_z$ film are as follows:

$0.6 \leq x \leq 0.9$ $0 \leq y \leq 0.4$ $0 \leq z \leq 0.3$ (thereby obtaining an Ni-rich soft magnetic film); or $0 \leq x \leq 0.4$ $0.2 \leq y \leq 0.95$ $0 \leq z \leq 0.5$ (thereby obtaining an Co-rich film).

A film having such a composition exhibits a low magnetostriction ($1 \times 10^{-5}$) which is required for an MR sensor or an MR head.

The thickness of the free layer 5 is preferably about 1 nm or more and about 10 nm or less. According to the shunting effect, the thicker the free layer 5 is, the smaller the MR ratio is. However, the overthin free layer 5 has a poor soft magnetic characteristic. The thickness of the free layer 5 is more preferably about 2 nm or more and about 7 nm or less.

Co or alloys such as Co-Fe, Ni-Fe, and Ni-Fe-Co are suitably used as the metal magnetic film 32 of the pinned layer 3. To obtain a large MR ratio, the Co or the Co-Fe alloy is preferable. Therefore, the Co-rich metal magnetic film 32 is preferably provided at the interface with the non-magnetic film 4.

$MFe_2O_4$ (where M is at least one of element selected from Fe, Co, and Ni) is suitably used as the oxide magnetic film 31 of the above-described pinned layers. The $MFe_2O_4$ exhibits a ferromagnetic characteristic up to high temperature. The resistances of Co and Ni-rich are much higher than that of Fe-rich films. Co-rich films have a large magnetic anisotropy. The desired characteristic of the film 31 can be obtained by adjusting molar fractions of these elements. In view of the soft magnetic characteristic and the saturated magnetization, $Fe_3O_4$ is preferable. $CoFe_2O_4$, which has great magnetic anisotropy and great coercive force, is preferable for the pinned layer 3, 3A, 3B, and 3C including the metal magnetic film 32 and the oxide magnetic film 31.

To produce the oxide magnetic film 31, sputtering is preferable, particularly when the desired thickness of the film 31 is a magnitude of the order of about 0.1 nm. When a target to be spattered contains $Fe_3O_4$ or $CoFe_2O_4$ as its major component, an inert gas such as Ar is used during sputtering so that an accurate thickness of the $Fe_2O_4$ or $CoFe_2O_4$ can be obtained. Since it is not necessary to introduce oxygen gas into a sputtering chamber, the chamber remains in a high vacuum state.

Even when $MFe_2O_4$ is used as a target, the resultant film may have less oxygen because some oxygen has been released from the target. In such a case, an amount of oxygen may be added to the sputtering gas (typically, a partial pressure ratio of oxygen gas to the inert sputtering gas is preferably about 0.1 or less).

The oxide magnetic film 31 of the pinned layer 3 can be formed by oxidizing part of the metal magnetic film 32. In this case, a sputtering target for the oxide magnetic film 31 is not required, resulting in easy production of the film 32. When a Co-Fe film is used as the metal magnetic film 32, the resultant Co-Fe-O film is a satisfactory oxide magnetic film 31.

There are various methods for producing such an oxide magnetic film 31. In one method, the metal magnetic film 32 is provided and thereafter a surface of the film 32 is oxidized. Examples of a method for oxidizing a surface of the metal magnetic film 32 include plasma oxidation, natural oxidation, and a method using a radical gun or an ion gun. In the plasma oxidation, rf or DC potential is applied between a surface of a metal film and an electrode to generate plasma in between while flowing oxygen gas into a chamber. The plasma oxidizes the surface of the metal film. Although damage to the surface of the metal film is large, the resultant oxide film can have relatively high resistance. In the natural oxidization, a metal film may be exposed to the atmosphere.

There is a problem with the atmosphere exposure such that the moisture content of the atmosphere is not constant in the atmosphere. Preferably, oxygen gas having a pressure equal to atmospheric pressure or less is introduced into a chamber to oxidize the surface of the metal film.

In the method using the radical gun, a surface of a metal film is irradiated and oxidized with oxygen radicals generated by an electric discharge in the gun. Only the surface of the metal film is oxidized and there is less damage to the surface of the metal film.

In the method using an ion gun, an accelerating voltage is applied to oxygen ions generated in the ion gun and a surface of a metal film is irradiated with the accelerated ions. An extremely high accelerating voltage damages the surface of the metal film. Preferably, the accelerating voltage is about 500 V or less, more preferably about 200 V or less. As an ion source, a thermal filament (Kauffmann type) or ECR discharge may be used.

Moreover, the total thickness of the pinned layer 3 is preferably in a range between about 1 nm and about 10 nm.

In order to increase the MR ratio, an interface magnetic layer may be provided between the ferromagnetic layer (the pinned layer 3 or the free layer 5) and the non-magnetic layer 4. An Ni-rich material is preferable for the free layer 5 which requires a soft magnetic characteristic. The interface magnetic layer is preferably made of a Co-rich material and the other layers are made of an Ni-rich material, thereby making it possible to obtain the high MR ratio without a loss in the soft magnetic characteristic of the free layer 5. When the thickness of the interface magnetic layer is great, the soft magnetic characteristic of the free layer 5 is degraded, resulting in a reduction in the magnetic field sensitivity of the MR ratio. The interface magnetic layer needs to be about 2 nm or less thick, more preferably about 1.8 nm or less thick, in order to function effectively. In order that the interface magnetic layer works effectively, the thickness thereof needs about 2 nm or more, more preferably about 1.8 nm or less. As a material of the interface magnetic layer, Co or a Co-rich Co-Fe alloy is preferable.

The non-magnetic films 33 shown in FIGS. 4 and 11, and the non-magnetic films 53 shown in FIGS. 12 and 13 are preferably metal non-magnetic films which tend to cause the exchange coupling between the magnetic layers. Cu, Ag, and Au are preferable as a material of the non-magnetic films 33 and 53, more preferably Ru, Rh, Ir, Re, and the like in view of the thermal stability of the interface. Particularly, Ru is preferable. As a material of a metal magnetic film which may be provided between the oxide magnetic film 31 and the non-magnetic film 33, a Co-rich material is preferable. Such a metal magnetic film allows enhancement of the exchange coupling between the two oxide magnetic films 31.

The non-magnetic layer 4 between the free layer 5 and the pinned layer 3 is preferably made of Cu, Ag, Au, and Ru. Particularly, Cu is preferable. The thickness of the non-magnetic film 4 needs to be at least about 0.9 nm or more so as to reduce the interaction between the free layer 5 and the pinned layer 3. The increased thickness of the non-magnetic layer 4 leads to a reduction in the MR ratio. Therefore, the thickness of the non-magnetic film 4 is preferably about 10 nm or less, more preferably about 3 nm or less. In the configurations shown in FIGS. 1 to 3, when the thickness of the non-magnetic film 4 is about 3 nm or less, the layers between the substrate 1 and the non-magnetic film 4 need to be flat. Poor flatness causes magnetic coupling between the two metal magnetic film 32 and the free layer 5 which should be magnetically separated, resulting in a reduction in a MR ratio and sensitivity. Therefore, the height of pits and protrusions in the interface between the magnetic layer and the non-magnetic layer is preferably about 0.5 nm or less.

The substrate 1 is made of glass, MgO, Si, $Al_2O_3$—TiC, or the like, and needs to have a smooth surface. The $Al_2O_3$—TiC substrate is suitable for the MR head.

Sputtering is suitable for a production method of the above-described layers. Examples of sputtering include DC sputtering, rf sputtering, and ion beam sputtering.

A magnetoresistance effect head can be constructed using the above-described magnetoresistance effect element of the present invention. FIG. 14A is a cross-sectional view illustrating a hard film bias type MR head 1400A according to an example of the present invention. In FIG. 14A, an MR element 9 is interposed between upper and lower shield gaps 11 and 14. Example of a material of the shield gaps 11 and 14 includes an insulator film such as $Al_2O_3$, $SiO_2$, and AlN.

Shields 10 and 15 are provided on the lower surface of the lower shield 11 and on the upper surface of the upper shield 14, respectively. The lower and upper shields 10 and 15 are made of soft magnetic film such as Ni-Fe(-Co), Co-Nb-Zr, and Fe-Ta-N alloys. The Ni-Fe(-Co) alloys are produced by plating. The Co-Nb-Zr alloys have excellent corrosion resistance and anisotropy controllability. The Fe-Ta-N alloys are very resistant to high temperature treatment and is therefore suitable when a pinning layer of the above-described (AB)$_2O_x$ which is formed on the substrate heated at high temperature is used.

The control of magnetic domain of the MR element 9 is performed using a bias magnetic field of a hard bias portion 12 including a hard film made of a Co-Pt alloy or the like. The MR element 9 is isolated via the shield gaps 11 and 14 from the shields 10 and 15. A change in a resistance of the MR element 9 is read by flowing a current into the element 9 via a read portion 13.

The higher the density of the hard disk, the shorter the recording wavelength. To read a shorter recording wavelength, the distance d between the shields 10 and 15 shown in FIG. 14A needs to be decreased. To this end, as is apparent from FIG. 14A, the thickness of the MR element 9 should be small, preferably at least about 20 nm or less. The pinning layer 2 made of an oxide serves as an insulator. Therefore, the pinning layer 2 is substantially part of the lower shield gap 11. Thus, the oxide pinning layer 2 contributes to a reduction in thickness d.

In the MR element 9, to prevent occurrence of the Barkhausen effect when the magnetization direction is changed in the free layer 5, the axis of easy magnetization of each of the free layers 5 shown in FIGS. 1, 2, 3, and 4 is preferably perpendicular to a magnetization direction to be detected. The axis of easy magnetization of the pinned layer 3 is preferably parallel to the magnetization direction to be detected.

FIG. 14B is a cross-sectional view illustrating a hard film bias type MR head 1400B according to an example of the present invention. In FIG. 14B, the head 1400B has the same configuration as that of the head 1400A shown in FIG. 14A, except that the head 1400B includes an anti-ferromagnetic bias portion 12A in stead of the hard bias portion 12 shown in FIG. 14A. The shield gap becomes narrow with the high density of the hard disk. A magnetic field from the hard bias portion 12 is absorbed in the shield. This adversely leads to a reduction in a bias magnetic field applied to the free layer 5 of the MR element 9. Such a problem is solved by providing the anti-ferromagnetic bias portion 12A. The element 1400B is formed more easily when the anti-ferromagnetic film of the MR element 9 differs from the anti-ferromagnetic film of the anti-ferromagnetic bias portion 12A than when both are the same. The MR element 9 and the antiferromagnetic bias portion 12A may be made of Pt-Mn and Ir-Mn, respectively.

The above-described MR head is of a horizontal giant magnetoresistance (GMR) head type. The present invention can be applied to a vertical GMR head. In the horizontal GMR head, a current direction is perpendicular to a magnetic field to be detected. On the other hand, in the vertical GMR head, a current direction is parallel to a magnetic field to be detected.

FIG. 15 is a cross-sectional view illustrating a yoke type magnetic head 1500 according to an example of the present invention. In FIG. 15, a yoke 16 make of soft magnetic film is provided to guide a magnetic field to be detected into an MR element 9. The yoke 16 is typically made of conductive metal magnetic film, so that an insulating film 17 is provided between the yoke 16 and the MR element 9 to prevent the short-circuit. The use of the yoke 16 results in less sensitivity than that of the MR heads 1400A and 1400B shown in FIGS. 14A and 14B. However, the MR element 9 does not need to be placed in the shield gaps unlike FIGS. 14A and 14B, thereby making it possible to obtain a super narrow gap.

The above-described MR heads 1400A, 1400B, and 1500 have excellent reproduction sensitivity. The use of these MR heads can realize a magnetic recording device having a density of 40 Gb/inch$^2$.

FIG. 17 is a cross-sectional view illustrating an example of a memory element 1700 including a magnetoresistance effect element according to the present invention. The memory element 1700 includes a MR element 9 having a free layer 5, a non-magnetic layer 4, and a pinned layer 3 according to the present invention, a conductive line 22 (word line) for recording information which is isolated from the MR element 9, and a conductive line 23 (sense line) for reading information which is connected to the MR element 9 via electrodes 21. The electrodes 21 are provided on the upper and lower surface of the MR element 9, respectively. The electrodes 21 may be provided on the right and left surface of the MR element 9, respectively. A pinning layer may be further provided on the lower surface of the pinned layer 3.

Referring to FIG. 17, a current flows through the word line 22 to generate a magnetic field. This magnetic field reverses the magnetization direction of the free layer 5 to write information. To read the information, a current flows again through the word line 22 to reverse the magnetization direction of the free layer 5. In this case, the magnetization direction is changed not in pinned layer 3 but in the free layer 5. The resistance of the MR element 9 varies depending on whether the magnetization direction of the free layer 5 is parallel or antiparallel to that of the pinned layer 3. The variations in the resistance of the MR element 9 are read from the sense line 23 to identify the state of the memory element as '1' or '0'.

In the above-described case, the information is erased in reading the information (destructive read). Non-destructive read is also possible in the following way: a current flows through the word line 22 to generate a sufficient magnetic field so that the magnetization directions of the pinned layer 3 as well as the free layer 5 are reversed; information is recorded in the pinned layer 3; to read the information, a weaker current flows through the word line 22 to generate a magnetic field such that the magnetization direction of the free layer 5 is reversed but not that of the pinned layer 3; the resultant variation in the resistance of the MR element 9 are read from the sense line 23 to identify the state of the memory element as '1' or '0'. In this case, different settings of the reverse magnetic fields are required for the pinned layer 3 and the free layer 5. This results in relatively complicated operation.

A so-called MRAM can be constructed by providing a plurality of the memory element 1700 in a matrix. In the MRAM, two word lines 22 are provided for each MR element 9 in such a way as to intersect orthogonally with each other. Writing/reading information into/from the MR element 9 is performed using a magnetic field generated by the word lines 22. This MRAM is nonvolatile and has less soft errors, and is therefore expected as a next-generation solid-state memory element.

EXAMPLES

Examples of the MR element, MR head, and MR memory element of the present invention will be described in greater detail below.

Example 1

A magnetoresistance effect element which has the same structure as shown in FIG. 1 except the pinning layer 2 was produced by using a multi-sputtering apparatus. The element included a substrate 1 made of Si, a non-magnetic layer 4 mainly made of Cu, a free layer 5 mainly made of $Ni_{0.68}Fe_{0.20}Co_{0.12}$, and a pinned layer 3. The pinned layer 3 included a metal magnetic layer 32 made of a $Co_{0.9}Fe_{0.1}$ and an oxide magnetic film 31 made of $CoFe_2O_4$. After a vacuum chamber was exhausted to about $1\times10^{-8}$ Torr or less, Ar gas was supplied therein so as to have a pressure of about 0.8 mTorr while the above described MR element was formed on the glass substrate 1 with sputtering. For comparison, a conventional Sample which did not include $CoFe_2O_4$ was produced.

The MR element of Example 1 is specified as follows:
NiFeCo(5)/Cu(2)/CoFe(2)/$CoFe_2O_4$(5)
where a number in parentheses represents the thickness of each layer in nanometer.

The MR characteristic of the thus-constructed MR element was evaluated with a DC four-terminal method where a maximum 200 kA/m of magnetic field was applied to the element at room temperature. The resulting MR ratio was a high value of about 16%. On the other hand, conventional Sample which did not include $CoFe_2O_4$ had inconsistent characteristic, and the MR ratio did not exceed about 10%. Hereinafter the MR ratio is given in percent.

Example 2

MR element 100 of the present invention shown in FIG. 1 was produced by using a multi-sputtering apparatus. Si was used for the substrate 1. Sintered NiO, α-$Fe_2O_3$, and $ABO_3$ (A=La; B=Fe), and $Pt_{0.5}Mn_{0.5}$ and $Ir_{0.2}Mn_{0.8}$ alloys were used as a target for the pinning layer 2.

Cu was used as a target for the non-magnetic layer. $Ni_{0.68}Fe_{0.20}Co_{0.12}$ was used as a main target for the free layer 5. $Co_{0.9}Fe_{0.1}$ was used as a target for the interface magnetic film for the free layer 5 and the metal magnetic film 32 of the pinned layer 3. $Fe_3O_4$ was used as a target for the oxide magnetic film of the pinned layer 3.

After a vacuum chamber was exhausted to about $1\times10^{-8}$ Torr or less, Ar gas was supplied therein so as to have a pressure of about 0.8 mTorr while the above described MR element 100 was formed on the glass substrate 1 with sputtering. For comparison, conventional Samples A to D which did not include $Fe_3O_4$ were produced.

Samples A to D are specified as follows.

Sample A: NiFeCo(3)/CoFe(1)/Cu(2)/CoFe(2.5)/PtMn(20)

Sample B: NiFeCo(3)/CoFe(1)/Cu(2)/CoFe(2.5)/IrMn(20)

Sample C: NiO(10)/α-$Fe_2O_3$(20)/CoFe(2.5)/Cu(2)/CoFe(1)/NiFeCo(3)

Sample D: $LaFeO_3$(40)/CoFe(2.5)/Cu(2)/CoFe(1)/NiFeCo(3)

Samples 1 to 4 of the element 100 are specified as follows.

Sample 1:
NiFeCo(3)/CoFe(1)/Cu(2)/CoFe(1)/$Fe_3O_4$(1.5)/PtMn(20)

Sample 2:
NiFeCo(3)/CoFe(1)/Cu(2)/CoFe(1)/$Fe_3O_4$(1.5)/NiFeCo(3)

Sample 3:
NiO(10)/α-$Fe_2O_3$(20)/$Fe_3O_4$(1.5)/CoFe(1)/Cu(2)/CoFe(1)/NiFeCo(3)

Sample 4:
$LaFeO_3$(40)/$Fe_3O_4$(1.5)/CoFe(1)/Cu(2)/CoFe(1)/NiFeCo(3)

Samples A and B, and Samples 1 and 2 had a structure in which the layers on the substrate were disposed in the reverse order of those shown in FIG. 1. In the above-described Samples, NiFeCo(3)/CoFe(1) corresponds to the free layer 5. In Samples A to D, CoFe(2.5) corresponds to the pinned layer 3. In Samples 1 to 4, CoFe(1)/$Fe_3O_4$(1.5) corresponds to the pinned layer 3.

The MR characteristic of thus-constructed MR elements were evaluated with a DC four-terminal method where a maximum 200 kA/m of magnetic field was applied to the element at room temperature. The results are shown in Table 1 where Hp represents a pinning magnetic field of each element.

TABLE 1

| Sample No. | MR ratio (%) | Hp (kA/m) |
|---|---|---|
| A | 8 | 80 |
| B | 11 | 40 |
| C | 16 | 20 |
| D | 12 | 45 |
| 1 | 13 | 80 |
| 2 | 14 | 40 |
| 3 | 19 | 40 |
| 4 | 15 | 50 |

As can be seen from Table 1, Samples according to the present invention have an increased MR ratio compared with conventional Samples. Furthermore, the use of the pinning layer 2 leads to an improvement in Hp.

Example 3

MR element 200 of the present invention shown in FIG. 2 was produced by using a multi-sputtering apparatus. An $Al_2O_3$ film was produced as the oxide non-magnetic film 6 by reactive-sputtering an Al target with Ar-and-$O_2$ gas mixture.

Samples 5 and 6 of the element 100 are specified as follows.

Sample 5:
PtMn(20)/$Fe_3O_4$(1.5)/CoFe(1)/Cu(2)/CoFe(1)/NiFeCo(3)/$Al_2O_3$(2)

Sample 6:
$Al_2O_3$(2)/NiFeCo(3)/CoFe(1)/Cu(2)/CoFe(1)/$Fe_3O_4$(1.5)/IrMn(15)

Sample 6 had a structure in which the layers on the substrate were disposed in the reverse order of those shown in FIG. 2. The MR characteristic of the thus-constructed MR elements were evaluated with a DC four-terminal method where a maximum 200 kA/m of magnetic field was applied to each element at room temperature. The results are shown in Table 2 where Hp represents a pinning magnetic field of the element.

TABLE 2

| Sample No. | MR ratio (%) | Hp (kA/m) |
|---|---|---|
| 5 | 15 | 80 |
| 6 | 16 | 40 |

When the results shown in FIG. 2 are compared with those of Samples 1 and 2, it is found that the MR ratio is improved.

Example 4

MR elements 500B and 700 of the present invention shown in FIGS. 5B and 7 were produced by using a multi-sputtering apparatus. Si was used for the substrate 1. Cu was used as a target for the non-magnetic layer 4. $Ni_{0.68}Fe_{0.20}Co_{0.12}$ was used as a target for the metal magnetic films 51 of the free layers 5A and 5B. $Fe_3O_4$ was used as a target for the oxide magnetic films 52 of the free layers 5A and 5B.

$Co_{0.9}Fe_{0.1}$ and $CoFe_2O_4$ were used as a target for the pinned layer 3 shown in FIG. 5B. $Co_{0.9}Fe_{0.1}$ was used as a target for the pinned layer 3D shown in FIG. 7. α-$Fe_2O_3$ was used as a target for the pinning layer 2.

After a vacuum chamber was exhausted to about $1\times10^{-8}$ Torr or less, Ar gas was supplied therein so as to have a pressure of about 0.8 mTorr while each of the above described MR elements 500B and 700 (Samples 7 and 8, respectively) were formed on the glass substrate 1 with sputtering.

Samples 7 and 8 are specified as follows.

Sample 7:
$CoFe_2O_4$(50)/$Co_{0.9}Fe_{0.1}$(2)/Cu(2)/$Ni_{0.68}Fe_{0.20}Co_{0.12}$(4)/$Fe_3O_4$(1)

Sample 8:
α-$Fe_2O_3$(50)/$Co_{0.9}Fe_{0.1}$(2)/Cu(2)/$Ni_{0.68}Fe_{0.20}Co_{0.12}$(2)/$Fe_3O_4$(1)/$Ni_{0.68}Fe_{0.20}Co_{0.12}$(3)

The MR characteristic of each of the thus-constructed MR elements 500B and 700 were evaluated with a DC four-terminal method where a maximum 200 kA/m of magnetic field was applied to the element at room temperature. The results are shown in Table 3 where Hp represents a pinning magnetic field of each element.

TABLE 3

| Sample No. | MR ratio (%) | Hp (kA/m) |
| --- | --- | --- |
| 7 | 12 | 35 |
| 8 | 13 | 40 |

To further improve the Hp characteristic shown in Table 3, the pinned layer 3 may include two magnetic films which are exchange-coupled via a non-magnetic film of Ru or the like.

In this case, the thickness of the oxide magnetic film 31 can be reduced. In Example 4, the metal magnetic film 51 of the free layer 5B was made of NiFeCo in view of the sensitivity.

On the other hand, the metal magnetic film 51 made of CoFe would enhance the MR ratio. According to this view point, a Sample 9 as specified below was produced further using Ru as a target.

Sample 9:
$\alpha$-Fe$_2$O$_3$(30)/Co$_{0.9}$Fe$_{0.1}$(2)/Ru(0.7)/CoFe(2)/Cu(2)/Co$_{0.9}$Fe$_{0.1}$(4)/Fe$_3$O$_4$(1)

The MR characteristic of the thus-constructed MR element was evaluated with a DC four-terminal method where a maximum 200 kA/m of magnetic field was applied to the element at room temperature. The results are shown in Table 4 where Hp represents a pinning magnetic field of each element.

TABLE 4

| Sample No. | MR ratio (%) | Hp (kA/m) |
| --- | --- | --- |
| 9 | 16 | 60 |

Thus, Sample 9 according to the present invention has an improved a MR ratio and an Hp.

Example 5

MR elements 700 and 800 of the present invention shown in FIGS. 7 and 8 were produced by using a multi-sputtering apparatus. Si was used for the substrate 1. Cu was used as a target for the non-magnetic film 4. Ni$_{0.8}$Fe$_{0.2}$ and Co$_{0.9}$Fe$_{0.1}$ was used as a target for the metal magnetic films 51 of the free layer 5B. Fe$_3$O$_4$ was used as a target for the oxide magnetic film 52 of the free layer 5B. Co$_{0.9}$Fe$_{0.1}$ and $\alpha$-Fe$_2$O$_3$ were used as targets for the pinned layer 3 and the pinning layer 2 shown in FIG. 7, respectively. Co$_{0.9}$Fe$_{0.1}$ and Fe$_3$O$_4$, and PtMn were used as targets for the pinned layer 3 and the pinning layer 2 shown in FIG. 8, respectively. In this element 800, a buffer layer made of Ta was provided between the substrate 1 and the PtMn pinning layer 2. After a vacuum chamber was exhausted to about 1×10$^{-8}$ Torr or less, Ar gas was supplied therein so as to have a pressure of about 0.8 mTorr while each of the above described MR elements 700 and 800 (Samples 10, 11 and 12, respectively) were formed on the glass substrate 1 with sputtering.

Samples 10, 11 and 12 are specified as follows.
Sample 10:
$\alpha$-Fe$_2$O$_3$(50)/Co$_{0.9}$Fe$_{0.1}$(2)/Cu(2)/Co$_{0.9}$Fe$_{0.1}$(2)/Fe$_3$O$_4$(1)/Ni$_{0.8}$Fe$_{0.2}$(3)
Sample 11:
Ta(5)/PtMn(15)/Co$_{0.9}$Fe$_{0.1}$(2)/Fe$_3$O$_4$(1)/Co$_{0.9}$Fe$_{0.1}$(2)/Cu(2)/Co$_{0.9}$Fe$_{0.1}$(5)
Sample 12:
Ta(5)/PtMn(15)/Co$_{0.9}$Fe$_{0.1}$(2)/Fe$_3$O$_4$(1)/Co$_{0.9}$Fe$_{0.1}$(2)/Cu(2)/Co$_{0.9}$Fe$_{0.1}$(2)/Fe$_3$O$_4$(1)/Ni$_{0.8}$Fe$_{0.2}$(3)

The MR characteristic of each of the thus-constructed MR elements were evaluated with a DC four-terminal method where a maximum 200 kA/m of magnetic field was applied to the element at room temperature. The results are shown in Table 5 where Hp represents a pinning magnetic field of each element.

TABLE 5

| Sample No. | MR ratio (%) | Hp (kA/m) |
| --- | --- | --- |
| 10 | 20 | 40 |
| 11 | 17 | 50 |
| 12 | 19 | 45 |

Example 6

MR element 400 of the present invention shown in FIG. 4 was produced by using a multi-sputtering apparatus. Si was used for the substrate 1. Cu was used as a target for the non-magnetic film 4. Ni$_{0.68}$Fe$_{0.20}$Co$_{0.12}$ was mainly used as a target for a free layer 5 and Co$_{0.9}$Fe$_{0.1}$ was used as a target for the metal magnetic film 32 of the pinned layer 3A. Fe$_3$O$_4$ was used as a target for the oxide magnetic film 31 of the pinned layer 3A. After a vacuum chamber was exhausted to about 1×10$^{-8}$ Torr or less, Ar gas was supplied therein so as to have a pressure of about 0.8 mTorr while each of the above described MR elements 400 (Samples 13 and 14) was formed on the glass substrate 1 with sputtering.

Samples 13 and 14 are specified as follows.
Samples 13:
NiFeCo(4)/Cu(2)/CoFe(2)/Fe$_3$O$_4$(2)/Ru(0.7)/Fe$_3$O$_4$(3)
Sample 14:
NiFeCo(4)/Cu(2)/CoFe(2)/Fe$_3$O$_4$(2)/CoFe(2)/Ru(0.7)/CoFe(2)/Fe$_3$O$_4$(3)

The MR characteristic of each of the thus-constructed MR elements were evaluated with a DC four-terminal method where a maximum 200 kA/m of magnetic field was applied to the element at room temperature. The results are shown in Table 6.

TABLE 6

| Sample No. | MR ratio (%) | Hp (kA/m) |
| --- | --- | --- |
| 13 | 13 | 20 |
| 14 | 13 | 30 |

Both Samples 13 and 14 exhibited a high MR ratio. Sample 14 had a large Hp.

A pinning layer of PtMn was further provided between the substrate 1 and the oxide magnetic film 31 of the pinned layer 3 in Samples 13 and 14. As a result, the Hp of both Samples 13 and 14 had a larger Hp of about 60 and 80 kA/m, respectively.

Example 7

MR heads 1400A shown in FIG. 14A (Samples H-1, H-5, and H-10) were produced using the above-described MR element 9 (Samples 1, 5, and 10) of the present invention. The characteristics of these heads were evaluated. The substrate 1 was made of Al$_2$O$_3$—TiC. The shields 10 and 15 were made of a Ni$_{0.8}$Fe$_{0.2}$ alloy. The shield gaps 11 and 14 were made of Al$_2$O$_3$.

The hard bias portion 12 was made of the Co-PT alloy. The lead portion 13 was made of Au.

Each of the free layers 5 were provided with magnetic anisotropy so that the axis of easy magnetization thereof was perpendicular to a magnetization direction to be detected. Each of the pinned layers 3 were provided with magnetic anisotropy so that the axis of easy magnetization thereof was parallel to a magnetization direction to be detected. To this end, the MR elements so produced were subjected to thermal treatment in a magnetic field at a temperature of 280° C. so that the axis of easy magnetization of the pinned layer 3 was determined, and then subjected to the thermal treatment at a temperature of 200° C. so that the axis of easy magnetization of the free layer 5 was determined.

To evaluate outputs of the above-described heads, a direct current was supplied as a sense current to each of the heads while applying a magnetic field generated an alternating current of about 3 kA/m thereto. The outputs of the MR heads using the MR elements of the present invention were compared with that of a head (Sample H-A) using conventional Sample A as a MR element. The results are shown in Table 7.

TABLE 7

| Sample No. | MR element | Relative output (dB) |
|---|---|---|
| H-A | A | 0 |
| H-1 | 1 | +4 |
| H-5 | 5 | +5 |
| H-10 | 10 | +6 |

Thus, the magnetic head of the present invention has a larger output than that of the conventional one.

Example 8

MR element 300 of the present invention having a dual structure was produced with a method similar to that described in Example 1. Samples of the MR element 300 are specified as follows.
Sample 15:
   PtMn(20)/Fe$_3$O$_4$(1.5)/CoFe(1)/Cu(2)/CoFe(1)/NiFeCo(3)/CoFe(1)/Cu(2)/CoFe(1)/Fe$_3$O$_4$(1.5)/PtMn(20)
   Sample 16:
   NiO(10)/α-Fe$_2$O$_3$(20)/Fe$_3$O$_4$(1.5)/CoFe(1)/Cu(2)/CoFe(1)/NiFeCo(3)/CoFe(1)/Cu(2)/CoFe(1)/Fe$_3$O$_4$(1.5)/IrMn(15)

The magnetoresistance effects of these MR elements were evaluated in a method similar to that of Example 1. The results are shown in Table 8.

TABLE 8

| Sample No. | MR ratio (%) | Hp (kA/m) |
|---|---|---|
| 15 | 22 | 80 |
| 16 | 22 | 40 |

As is seen from Table 8, extremely large MR ratios were obtained.

Example 9

The yoke type head 1500 shown in FIG. 15 using a MR element (Sample 15) of the present invention was produced. The insulator film 17 in FIG. 15 was an Al-O super-thin film having a thickness of about 2 nm which was formed with the plasma oxidization. The yoke 16 was made of CoNbZr amorphous alloy film having a high level of magnetic permeability. The output of the thus-constructed head 1500 was compared with that of a head using a conventional head (Sample A). The output of the head 1500 was increased by about 6 dB.

Example 10

MR element 900 (Sample 17) of the present invention shown in FIG. 9 was produced by using a multi-sputtering apparatus. Si was used for the substrate 1, and a thermal oxide film having a thickness of about 100 nm was formed in the surface of the substrate 1. Ta was used for the layer 7. Co$_{0.9}$Fe$_{0.1}$ was used for the free layer 5 and the metal magnetic film 32 of the pinned layer 3B. Cu was used as a target for the non-magnetic film 4. Pt$_{0.5}$Mn$_{0.5}$ was used for the pinning layer 2. After a vacuum chamber was exhausted to about 1×10$^{-8}$ Torr or less, Ar gas was supplied therein so as to have a pressure of about 0.8 mTorr while the chamber is exhausted. A Ta film (about 5 nm) was formed on the substrate 1. Thereafter, the free layer 5 of Co$_{0.9}$Fe$_{0.1}$ (about 2 nm), the non-magnetic layer 4 of Cu (about 2 nm), and the metal magnetic film 32 of Co$_{0.9}$Fe$_{0.1}$ (about 3 nm) were successively formed on the Ta film with sputtering (step 1). The sputtering discharge was temporarily stopped and approximately one-eighth as much oxygen gas as the whole gas was supplied in addition to the Ar gas. A radical gun was actuated by a power of about 100 W to generate oxygen radicals. The upper surface of the metal magnetic film 32 was then irradiated by the oxygen radicals to be oxidized by a depth of about 1 nm. This results in the oxide magnetic film 31 of the pinned layer 3B (step 2).

The sputtering discharge and the gas flow were temporarily stopped. Ar gas was introduced again to the chamber. A Co$_{0.9}$Fe$_{0.1}$ film (about 2 nm) was formed with sputtering as the upper metal magnetic film 32 of the pinned layer 3 (step 3).

Thereafter, a Pt$_{0.5}$Mn$_{0.5}$ film (about 20 nm) was formed with sputtering as the pinning layer 2 (step 4). A Ta film was then provided as the oxide non-magnetic film 6 on the upper surface of the pinning layer 2. Subsequently, the resultant multi-layer structure was placed in vacuum in the presence of an applied magnetic field of about 1 kOe at a temperature of 260° C. for 3 hours. On the other hand, a conventional Sample E was produced with the same method as that used for Sample 17 except that step 2 was not included therein.

Samples 17 and E are specified as follows.
Sample 17:
   Ta(5)/Co$_{0.9}$Fe$_{0.1}$(2)/Cu(2)/Co$_{0.9}$Fe$_{0.1}$(2)/CoFeO(1)/Co$_{0.9}$Fe$_{0.1}$(2)/Pt$_{0.5}$Mn$_{0.5}$(20)/TaO(3) (the thickness of the CeFeO film was one before the film was oxidized)
Conventional Sample E:
   Ta(5)/Co$_{0.9}$Fe$_{0.1}$(2)/Cu(2)/Co$_{0.9}$Fe$_{0.1}$(5)/Pt$_{0.5}$Mn$_{0.5}$(20)/TaO(3)

In Sample 17, the lower metal magnetic film 32 of the pinned layer 3B was oxidized using the radical gun. Other Samples 18, 19, and 20 were produced with the same method as used for Sample 17 except that such oxidization was performed in a different way.

Sample 18 was produced using the natural oxidization in step 2 where after step 1 had been performed. Specifically the chamber was exhausted and oxygen gas was then supplied into the chamber to a pressure of about 20 Torr. Next, Sample was planed in the chamber for an appropriate time so that the upper surface of the Co$_{0.9}$Fe$_{0.1}$ film was oxidized to a depth of about 1 nm. After step 2, the chamber was exhausted to about 1×10$^{-8}$ Torr or less again. Steps 3 and 4 and the thermal treatment were performed to obtain Sample 18 having the same structure as that of Sample 17.

Sample 19 was produced using the plasma oxidization as step 2 after step 1 had been performed. Specifically, the chamber was exhausted; oxygen gas was than supplied into the chamber to have a pressure of about 3 mTorr: and a RF voltage of about 0.01 W/cm² was applied to a substrate holder aide, and the upper surface of the metal film was oxidized. After step 2, the chamber was exhausted to about $1 \times 10^8$ Torr or less again. Steps 3 and 4 and the thermal treatment were performed to obtain Sample 19 having the same structure is that of Sample 17.

Sample 20 was produced using the method using an ion gun, which uses ECR plasma, in step 2 after step 1 had been performed. Specifically, the chamber was exhausted; oxygen gas of about 4 sccm and Ar gas of about 0.4 sccm were then supplied into the chamber while microwave energy of about 2 GHz is applied to an ion gun, so that plasma was generated; and the oxygen gas in the plasma state was driven by an accelerating voltage of about 50 V to irradiate the upper surface of the metal film. After step 2, the chamber was exhausted to about $1 \times 10^{-8}$ Torr or less again. Steps 3 and 4 and the thermal treatment were performed to obtain Sample 20 having the same structure as that of Sample 17.

Sample 21 was produced using the reactive sputtering in step 2 after step 1 had been performed to provide the $Co_{0.9}Fe_{0.1}$ film (abort 2 nm). Specifically oxygen gas and Ar gas having a mixture ratio of 8:2 were supplied into the chamber to have a pressure of about 8 mTorr; and the $Co_{0.9}Fe_{0.1}$ film (about 2 nm) was subjected to sputtering so as to form the CoFeO film having the same thickness is that of Sample 17. After step 2, the chamber was exhausted to about $1 \times 10^{-8}$ Torr or less again. Steps 3 and 4 and the thermal treatment were performed to obtain Sample 21 having the same structure as that of Sample 17.

The magnetoresistance effect characteristic of each of the thus-constructed MR elements were evaluated where a magnetic field of 400 kA/m was applied to the element at room temperature. The results are shown in Table 9.

TABLE 9

| Sample No. | MR ratio (%) | Hp (kA/m) |
|---|---|---|
| 17 | 13 | 78 |
| 18 | 13.5 | 60 |
| 19 | 12 | 75 |
| 20 | 12.8 | 70 |
| 21 | 13.3 | 68 |
| E | 8 | 75 |

As is seen from Table 9, Samples 19 to 21 of the present invention have almost the same Hp as that of conventional Sample E and higher MR ratios than that of conventional Sample E.

Example 11

MR element 1000 (Sample 22) shown in FIG. 10 was produced using a sputtering method similar to that of Example 10. The element 1000 has the same structure as that shown in FIG. 9 except that the order of the free layer 5, the non-magnetic layer 4, the pinned layer 3B and the pinning layer 2 is reversed.

The method of producing the element 1000 is the same as that used in FIG. 9 except that the order of processes is reversed. In Sample 22, the substrate 1 was made of Si, part of which was a thermally oxidized film. The free layer 5 included a $Ni_{0.8}Fe_{0.2}$ film and a Co film. The pinned layer 3B included a $Co_{0.8}Fe_{0.2}$ film a CoFeO film, and a $Co_{0.8}Fe_{0.2}$ film. The pinning layer 2 included a $Pt_{0.5}Mn_{0.5}$ film. Similar to Sample 17, the CoFeO film was formed using the radical gun. For comparison, a conventional Sample F which did not include the oxide magnetic film 31 was also produced. Sample 22 and conventional Sample F are specified as follows.

Sample 22:

$Ta(5)/Pt_{0.5}Mn_{0.5}(15)/Co_{0.8}Fe_{0.2}(2)/CoFeO(1)/Co_{0.8}Fe_{0.2}(2)/Cu(2)/Co(0.5)/Ni_{0.8}Fe_{0.2}(3)/TaO(3)$ (the thickness of the CoFeO film was one before the film was oxidized)

Conventional Sample F:

$Ta(5)/Pt_{0.5}Mn_{0.5}(15)/Co_{0.8}Fe_{0.2}(5)/Cu(2)/Co(0.5)/Ni_{0.8}Fe_{0.2}(3)/TaO(3)$

Sample 22 and Conventional Sample F were evaluated with a method similar to that of Example 10. The results are shown is Table 10.

TABLE 10

| Sample No. | MR ratio (%) | Hp (kA/m) |
|---|---|---|
| 22 | 15 | 67 |
| F | 9 | 66 |

As is seen from Table 10, Sample 22 of the present invention has a higher MR ratio compared with that of conventional Sample F.

Example 12

MR elements 1100A (Samples 23 and 24) shown in FIG. 11A were produced by using a sputtering method similar to that of Example 10. The elements 1100A have the pinned layer 3C which has a so-called synthetic antiferromagnet structure. In FIG. 11A the non-magnetic film 33 is typically made of Ru. When the non-magnetic film 33 has a thickness of about 0.4 nm to about 1 nm, the metal magnetic films 33 are antiferromagnetically exchange-coupled via the non-magnetic film 33. This exchange-coupling magnetic field is very strong, so that the pinned layer 3C has a very large reversed magnetic field. The MR element 1100A further includes only the non-magnetic film 33 as compared pith the MR element 900 in FIG. 9. The production method of the MR element 1100A does not require many additional steps. In each of Samples 23 and 24, the substrate 1 was made of Si, part of which was a thermally oxidized film. The free layer 5 included a $Ni_{0.8}Fe_{0.2}$ film and a Co film. The pinned layer 3C included a $Co_{0.9}Fe_{0.1}$ film (about 2 nm), a CoFeO film (about 1 nm), and a $Co_{0.9}Fe_{0.1}$ film (about 2 nm). The pinning layer 5 included a $Ir_{0.2}Mn_{0.5}$ film or an $\alpha\text{-}Fe_2O_3$ film.

Similar to Sample 17, the CoFeO film was formed using a radical gun . For comparison a conventional Sample G which did not include the oxide magnetic film S2 was also produced. Samples 23 and 24 and conventional sample G are specified as follows.

Sample 23:

$Ta(3)/Ni_{0.8}Fe_{0.2}(5)/Ir_{0.2}Mn_{0.8}(10)/Co_{0.9}Fe_{0.1}(2)/Ru(0.7)/Co_{0.9}Fe_{0.1}(2)/COFeO(1)/Co_{0.9}Fe_{0.1}(2)/Cu(2)/Co(0.5)/Ni_{0.8}Fe_{0.2}(3)/Tao(3)$ (the thickness of the CoFeO film was one before the film was oxidized)

Sample 24:

$\alpha\text{-}Fe_2O_3(20)/Co_{0.9}Fe_{0.1}(2)/Ru(0.7)/Co_{0.9}Fe_{0.1}(2)/CoFeO(1)/Co_{0.9}Fe_{0.1}(2)/Cu(2)/CO(0.5)/Ni_{0.8}Fe_{0.2}(3)/TaO(3)$ Conventional Sample G:

$Ta(3)/Ni_{0.8}Fe_{0.2}(5)/Ir_{0.2}Mn_{0.8}(10Co_{0.9}Fe_{0.1}(2)/Ru(0.7)/Co_{0.9}Fe_{0.1}(2)/Cu(2)/Co(0.5)/Ni_{0.8}Fe_{0.2}(3)/TaO(3)$

Samples 23 and 24 and conventional Sample G were evaluated with a method similar to that of Example 10. The results are shown in Table 11.

TABLE 11

| Sample No. | MR ratio (%) | Hp (kA/m) |
|---|---|---|
| 23 | 15 | 100 |
| 24 | 18 | 60 |
| G | 9 | 95 |

As is seen from Table 11, Samples 23 and 24 of the present invention have a higher MR ratio compared with that of conventional Sample G, although sample 24 is which the pinging layer 2 included the $\alpha$-$Fe_2O_3$ film has a relatively small Hp.

Example 13

MR elements 1000 (Samples 25 and 26) shown in FIG. 10 were produced by using a sputtering method similar to that of Example 1. The elements 1000 have the free layer 5 in which two synthetic antiferromagnetic free layers (not shown) and the non-magnetic layer (made of Ru, not shown). The two synthetic antiferromagnetic free layers have different thicknesses or saturated magnetization, and are antiferromagnetically exchange-coupled via the non-magnetic layer. The use of the two synthetic antiferromagnetic free layers virtually decreases the thickness of the free layer 5 to the difference between the thicknesses (magnetization) of the two synthetic antiferromagnetic free layers. This enhances the sensitivity of a head which includes such an element. In Samples 25 and 25, a $Co_{0.9}Fe_{0.1}$ ferromagnetic film was used as the free layer 5. A $Fe_3O_4$ film was used as the oxide magnetic film 31 of the pinned layer 3B. A $Co_{0.9}Fe_{0.1}$ film (about 2 nm) was used as the metal magnetic film 32 of the pinned layer 38. A $Pt_{0.5}Mn_{0.5}$ film (about 20 nm) was used as the pinning layer 2. The non-magnetic layer 4 was made of Cu. For comparison, a conventional Sample H was also produced. Samples 25 and 26 and conventional Sample H are specified as follows.

Sample 25:
Ta(5)/$Pt_{0.5}Mn_{0.5}$(20)/$Co_{0.9}Fe_{0.1}$(1)/$Fe_3O_4$(1.5)/$Co_{0.9}Fe_{0.1}$(2)/Cu(2)/$Co_{0.9}Fe_{0.1}$ (2)/$Fe_3O_4$(1)/$Co_{0.9}Fe_{0.1}$(3)/Ru(0.7)/$Co_{0.9}Fe_{0.1}$(4)/TaO(3)

Sample 26:
Ta(5)/$Pt_{0.5}Mn_{0.5}$(20)/$Co_{0.9}Fe_{0.1}$(1)/$Fe_3O_4$(1.5)/$Co_{0.9}Fe_{0.1}$(2)/Cu(2)/$Co_{0.9}Fe_{0.1}$(2)/$Fe_3O_4$(1)/$Co_{0.9}Fe_{0.1}$(2)/Ru(0.7)/$Co_{0.9}Fe_{0.1}$(3)TaO(3)

Conventional Sample H:
Ta(5)/$Pt_{0.5}Mn_{0.5}$(20)/$Co_{0.9}Fe_{0.1}$(3)/Cu(2)/$Co_{0.9}Fe_{0.1}$(5)/Ru(0. 7)/$Co_{0.9}Fe_{0.1}$(4)/TaO(3)

The MR heads 1400A shown in FIG. 14A were produced using Samples 25 and 26 and H as the MR element 9 (corresponding to Sample heads H-25, H-26, and H-H, respectively). The characteristics of these heads were evaluated. The substrata 1 was made of $Al_2O_3$-TiC. The shields 10 and 15 were made of a $Ni_{0.8}Fe_{0.2}$ alloy. The shield gaps 11 and 14 were made of $Al_2O_3$.

The hard bias portion 12 was made of Co-Pt alloy. The lead portion 18 was made of Au.

Each of the free layers 5 was provided with magnetic anisotropy so that the axis of easy magnetization thereof was perpendicular to a magnetization direction to be detected. Each of the pinned layers 3 was provided with magnetic anisotropy so that the axis of easy magnetization thereof was parallel to a magnetization direction to be detected. To this end, the MR elements so produced were subjected to thermal treatment in a magnetic field at a temperature of 280° C. so that the axis of easy magnetization of the pinned layer 3 was determined, end then subjected to the thermal treatment at a temperature of 200° C. so that the axis of easy magnetization of the free layer 5 was determined.

To evaluate outputs of the above-described heads, a direst current was supplied as a sense current to each of the heads while applying a magnetic field generated an alternating current of about 3 kA/m thereto. The outputs of the MR heads using the MR elements of the present invention were compared with that of a head using conventional Sample A as a MR element. The results era shown in Table 12.

TABLE 12

| Sample No. | MR element | Relative output (dB) |
|---|---|---|
| H-H | H | 0 |
| H-25 | 15 | +6 |
| H-26 | 16 | +7 |

Thus, the magnetic head of the present invention has a larger output than that of the conventional one.

Example 14

MR elements 1100A (Samples 27 and 28) shown in FIG. 11A were produced by using a sputtering method similar to that of Example 1. In Samples 27 and 28, the free layer 5 included an ferromagnetic $Co_{0.9}Fe_{0.1}$ film. The oxide magnetic film 31 of the pinned layer 3C included a $Fe_3O_4$ film. The metal magnetic film 32 of the pinned layer 3C included a $Co_{0.9}Fe_{0.1}$ film. The pinning layer 2 included a $Pt_{0.5}Mn_{0.5}$ film. The non-magnetic film 4 was made of Cu. The non-magnetic film 33 of the pinned layer 3C was made of Ru, which was used for exchange coupling. Ta was used for a protection film. For comparison, a conventional Sample I was also produced. Samples 27 and 28 and conventional Sample I are specified as follows.

Sample 27:
Ta(5)/$Pt_{0.5}Mn_{0.5}$(15)/$Co_{0.9}Fe_{0.1}$(2)/Ru(0.7)/$Co_{0.9}Fe_{0.1}$(2)/$Fe_3O_4$(1.2)/$Co_{0.9}Fe_{0.1}$(2)/Cu(2)/$Co_{0.9}Fe_{0.1}$(2)/TaO(3)

Sample 28:
Ta(5)/$Pt_{0.5}Mn_{0.5}$(15)/$Co_{0.9}Fe_{0.1}$(2)/Ru(0.7)/$Co_{0.9}Fe_{0.1}$(2)/$Fe_2O_4$(1)/$Co_{0.9}Fe_{0.1}$(2)/Cu(2)/$Co_{0.9}Fe_{0.1}$(2)/TaO (3)

Conventional Sample I:
Ta(5)/$Pt_{0.5}Mn_{0.5}$(15)/$Co_{0.9}Fe_{0.1}$(2)/Ru(0.7)/$Co_{0.9}Fe_{0.1}$(2)/$Co_{0.9}Fe_{0.1}$(2)/Cu(2)/$Co_{0.9}Fe_{0.1}$(2)/TaO(3)

Similar to Example 13, MR heads were produced using Samples 27 and 28 of the present invention and conventional Sample I (corresponding to Sample heads H-27, H-28, and H-I. respectively). To evaluate outputs of the heads, a direct current was supplied as a sense current to each of the heads while applying a magnetic field generated an alternating current of about 3 kA/m thereto. The outputs of the MR heads using the MR elements of the present invention were compared with that of the head using conventional Sample I as a MR element. The results are shown in Table 13.

TABLE 13

| Sample No. | MR element | Relative output (dB) |
|---|---|---|
| H-I | I | 0 |
| H-27 | 17 | +8 |
| H-28 | 18 | +8 |

Thus, the magnetic head of the present invention has a larger output than that of the conventional one.

Each of the magnetic heads 1400A; 1400B, and 1500 having an MR element of the present invention was incorporated into a hard disk drive apparatus 1600 shown in FIG. 16. All the apparatuses 1600 could record data onto the hard disk at a density of about 20 Gb/inch$^2$ or more.

Example 15

MR element 1100A (Samples 29 and 30) shown in FIG. 11A having a combination of the structures of Examples 13 and 14 were produced. In Samples 29 and 30, the free layer 5 included ferromagnetic $Ni_{0.68}Fe_{0.2}Co_{0.12}$ films. The oxide magnetic film 31 of the pinned layer 3C included a FeAlO film and a FeSiO film, which was formed with reactive sputtering using $Fe_{0.8}Al_{0.2}$ and $Fe_{0.8}Al_{0.2}$ as targets. The metal magnetic film 32 of the pinned layer 3C included a $Co_{0.9}Fe_{0.1}$ film. The pinning layer 2 included a $Pt_{0.5}Mn_{0.5}$ film. The non-magnetic layer 4 was made of Cu. The non-magnetic film 33 of the pinned layer 3C used for exchange coupling was made of Ru. Ta was used for a protection film. Samples 29 and 30 are specified as follows.

Sample 29:
$Ta(3)/Pt_{0.5}Mn_{0.5}(15)/Co_{0.9}Fe_{0.1}(3)/Ru(0.7)/Co_{0.9}Fe_{0.1}(2)/FeAlO(1)/Co_{0.9}Fe_{0.1}(2)/Cu(2.2)/Ni0FeCo(3)/Ru(0.7)/NiFeCo(2)/TaO(3)$ Sample 30:
$Ta(3)/Pt_{0.5}Mn_{0.5}(15)/Co_{0.9}Fe_{0.1}(3)/Ru(0.7)/Co_{0.9}Fe_{0.1}(2)/FeSiO(1)/Co_{0.9}Fe_{0.1}(2)/Cu(2.2)/Ni0FeCo(3)/Ru(0.7)/NiFeCo(2)/TaO(3)$ Referring to FIG. 17, the thus-constructed MR element 9 was patterned into squares having a side of about 0.5 μm. The electrodes 21 of Cu/Pt were attached to each square of the MR element 9. The sense lines 23 were connected to the electrodes 21. The MR element 9 was isolated with $Al_2O_3$. Thereafter, the word line 22 of Cu was provided over the MR element 9. Thus, the MR memory element 1700 was produced.

A current was supplied to the word line 22 to reverse the magnetization of the free layer b of NiFeCo/Ru/NiFeCo so as to write information. Subsequently, a current was supplied to the word line in the same direction as in the write operation. In this case, variation in the resistance of the sense line 29 substantially was not observed. When a current was supplied in a different direction, variation in the resistance of the sense line 23 was clearly observed. Thus, the memory element 1700 using the MR element 9 of the present invention could be correctly operated.

Example 16

MR element 1500 (Sample 31) shown in FIG. 13 was produced. The element 1500 includes the oxide magnetic film 52 in the free layer 5D. An electrode including a Cu film and a Pt film was provided on the substrate 1. In Sample 31, the free layer 5D included antiferromagnetic $Ni_{0.68}Fe_{0.2}Co_{0.12}$ films as the metal magnetic films 51. The oxide magnetic film 52 of the free layer 5D included a $Fe_3O_4$ film. The metal magnetic film 32 of the pinned layer 3C included a $Co_{0.9}Fe_{0.1}$ film. The pinning layer 2 included a $Pt_{0.5}Mn_{0.5}$ film. The non-magnetic layer 4 was made of Cu. The non-magnetic film S3 of the pinned layer 3C need for exchange coupling was made of Ru. Ta was used for a protection film. An upper electrode on the free layer 5D was made of Pt. Sample 31 is specified as follows.

Sample 31:
$Cu(100)/Pt(10)/Ta(3)/Pt_{0.5}Mn_{0.5}(15)/\ Co_{0.9}Fe_{0.1}(3)/Ru(0.7)/Co_{0.9}Fe_{0.1}\ (2)/Fe_3O_4(0.6)/Co_{0.9}Fe_{0.1}(2)/Cu(2.2)/NiFeCo(2)/Fe_3O_4(0.6)/NiFeCo(1)/Ru(0.7)/NiFeCo(2)/Ta(3)/Pt(10)$ The thus-constructed MR element 9 was patterned into squares having a side of about 0.3 μm, leaving the Cu/Pt lower electrode intact. The entire element 9 was isolated with an $Al_2O_3$ film. A through hole was provides through from the upper electrode 21 to the lower electrode 11. The sense lines 23 of Cu were connected to the upper and lower electrodes. The MR element 9 was isolated with $Al_2O_3$. Thereafter, the word line 22 of Cu was provided over the MR element 9. Thus, the MR memory element 1700 as shown in FIG. 17 was produced. Similar to Example 15, a current was supplied to the word line 22 to reverse the magnetization of the free layer 6 of NiFeCo/Ru/NiFeCo so as to write information. Subsequently, when a current was supplied to the word line again, variation in the resistance of the sense line 23 was observed. Thus, the memory element 1700 using the MR element of the present invention could operate correctly at such a size. Moreover, the memories of Examples 15 and 16 were confirmed to be nonvolatile.

Example 17

Figure 11B:
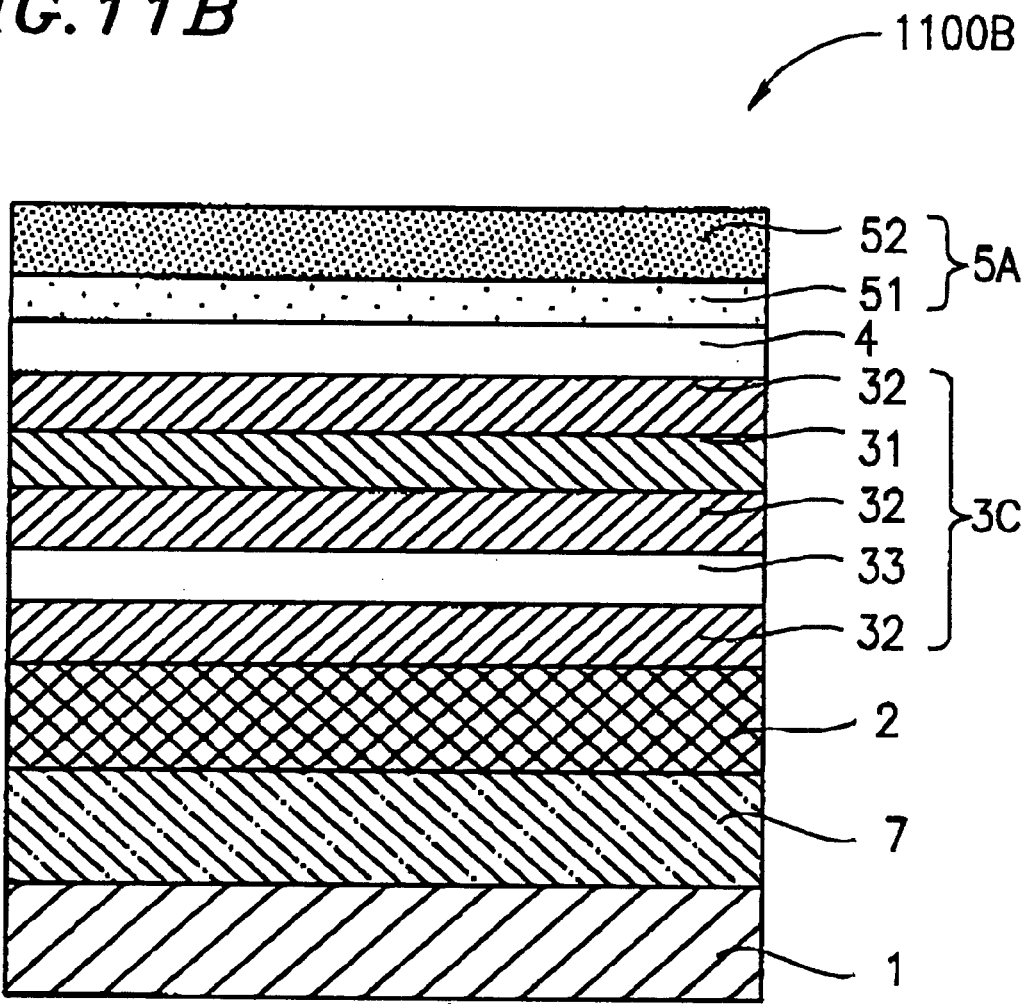

An MR element 1100B shown in FIG. 11B was produced by sputtering with a film forming apparatus having a multi-dimensional sputtering cathodes. To produce the MR element 1100B $Pt_{0.5}Mn_{0.5}$ was used as a target for a pinning layer 2. Ta was used as a target for a layer 7. $Co_{0.9}Fe_{0.1}$ was used as a target for a metal magnetic layer 32. Ru was used as a target for a non-magnetic layer 39. $Fe_3O_4$ was used as a target for an oxide magnetic layers 31 and 52. Cu was used as a target for a non-magnetic layer 4. $Co_{0.9}Fe_{0.1}$ and $Ni_{0.8}Fe_{0.2}$ were used as targets for a metal magnetic film 51 of a free layer 5A. Ar gas was used as inert gas for sputtering. Alternatively, Kr, Xe, or the like may also be used. About 1% $O_2$ gas was supplied together with the or gas only when the oxide magnetic films 31 and 32 was to be formed. The reason the $O_2$ gas was added is that the $Fe_3O_4$ target has a smaller amount of $O_2$ after a long-term high vacuum sputtering, and thus the amount, of oxygen needs to be supplemented so that the amount of oxygen in forming the oxide magnetic film can be adjusted when the sputtering is performed in a high vacuum. An appropriate amount of oxygen is about 10% or less of the total gas pressure.

In Example 17, the $Fe_3O_4$ target which has a relatively smaller amount of $O_2$ after a long-term high vacuum sputtering was used. After a vacuum chamber was exhausted to about $1 \times 10^{-9}$ Torr or less, sputtering gas was supplied therein so as to have a pressure of about 0.8 mTorr while the above described MR element was formed on the S1 substrata 1 with sputtering. For comparison, a conventional Sample J which did not have as oxide magnetic film. Sample 32 of the present invention and conventional Sample J are specified as follows.

Sample 32:
$Ta(3)/Pt_{0.5}Mn_{0.5}(1)/Co_{0.9}Fe_{0.1}(2)/Ru(0.7)/Co_{0.9}Fe_{0.1}(1.5)/Fe_3O_4(1)/Co_{0.9}Fe_{0.1}(1.5)/Cu(2)/Co_{0.9}Fe_{0.1}(1)/Ni_{0.8}Fe_{0.2}(2)/Fe_3O_4(1)Ta(3)$ Conventional Sample J:
$Ta(3)/Pt_{0.5}Mn_{0.5}(1)/Co_{0.9}Fe_{0.1}(2)/Ru(0.7)/Co_{0.9}Fe_{0.1}(3)/Cu(2)Co_{0.9}Fe_{0.1}(1)/Ni_{0.8}Fe_{0.2}(2)/Ta(3)$ The characteristics of the thus-constructed MR elements were compared with each other in a method similar to that in Example 12. The results are shown in Table 14.

TABLE 14

| Sample No. | MR ratio (%) | Hp (kA/m) |
|---|---|---|
| 32 | 13.1 | 80 |
| J | 7.5 | 80 |

As is seen from Table 14, Sample 32 of the present invention has substantially the same Hp as that of conventional Sample J because Sample 32 has the oxide magnetic films 31 and 52. Sample 32 also has a higher MR ratio than that of conventional Sample J.

Further, a Sample 33 was produced in which the $Fe_3O_4$ oxide magnetic film 52 was replaced with an $Al_2O_3$ film produced using an $Al_2O_3$ target. Sample 33 is specified as follows.

Sample 33:

$Ta(3)/Pt_{0.5}Mn_{0.5}(1)/Co_{0.9}Fe_{0.1}(2)/Ru(0.7)/Co_{0.9}Fe_{0.1}(1.5)/Fe_3O_4(1)/Co_{0.9}Fe_{0.1}(1.5)/Cu(2)/Co_{0.9}Fe_{0.1}(1)/Ni_{0.8}Fe_{0.2}(2)/Al_2O_3(1)/Ta(3)$

Sample 33 had a MR ratio of 12.8% which is as large as that of Sample 92. In this case, however, the soft magnetic characteristic of the free layer 5A was degraded in Sample 33; so that the reversed magnetic field (coercive force) of the free layer 5A was about 10 Oe in Sample 33 which is an increase over about 3 Oe in Sample 32. This suggests that the oxide magnetic film 52 not only mirror-reflects electrons, but also improves the soft magnetic characteristic.

As described above, the magnetoresistance effect element of the present invention can obtain a larger MR ratio than that of a conventional one. A magnetoresistance effect type head including such a MR element can obtain a high level of output. This MR type head can read a high density disk of a magnetic recording apparatus. Moreover the use of the MR element of the present invention can realize a non-volatile and high-density MR memory element.

Various other modifications will be apparent to and can be readily made by those skilled in the art without departing from the scope and spirit of this invention. Accordingly, it is not intended that the scope of the claims appended hereto be limited to the description as eat forth herein, but rather that the claims be broadly construed.

What is claimed is:

1. A magnetoresistance effect element comprising:
    a free layer, wherein a magnetization direction thereof is easily rotated in response to an external magnetic field;
    a first non-magnetic layer; and
    a first pinned layer provided on a side opposite to the free layer of the first non-magnetic layer, wherein a magnetization direction of the first pinned layer is not easily rotated in response to the external magnetic field,
    wherein at least one of the first pinned layer and the free layer includes a first metal magnetic film contacting the first non-magnetic layer, and a first oxide magnetic film, and
    the first pinned layer includes the first metal magnetic film and the first oxide magnetic film.

2. A magnetoresistance effect element according to claim 1 further comprising:
    a second non-magnetic layer provided on a side opposite to the first non-magnetic layer of the free layers and
    a second pinned layer provided on a side opposite to the free layer of the second non-magnetic layer wherein a magnetization direction of the second pinned layer is not easily rotated in response to the external magnetic field.

3. A magnetoresistance effect element according to claim 1, wherein the free layer includes the first metal magnetic film and the first oxide magnetic film.

4. A magnetoresistance effect element according to claim 3, wherein the free layer further comprises a second metal magnetic film provided on a side opposite to the first metal magnetic film of the first oxide magnetic film.

5. A magnetoresistance effect element according to claim 1 further comprising:
    an oxide non-magnetic film provided on a side opposite to the first non-magnetic layer of the free layer, having satisfactory flatness.

6. A magnetoresistance effect element according to claim 1 further comprising:
    a pinning layer magnetically coupled to the first oxide magnetic film.

7. A magnetoresistance effect element according to claim 6, wherein the pinning layer comprises P~Mn where P is at least one element selected from Pt, Ni, Pd, Ir, Rh, Ru, and Cr.

8. A magnetoresistance effect element according to claim 6, wherein the pinning layer comprises either $\alpha\text{-}Fe_2O_3$ or NiO, or both, or includes an $\alpha\text{-}Fe_2O_3$ film and a NiO film.

9. A magnetoresistance effect element according to claim 6, wherein the pinning layer comprises an $(AB)_2O_x$ layer where a ratio of a combination of element A and element B to oxygen is equal to 2:x; 2.8<x<32; and where t is defined as:

$$t = (Ra+Ro)/(\sqrt{2}\cdot(Rb+Ro))$$

(where Ra, Rb, and Ro denote the ion radii of the atoms A, B, and O, respectively) and t satisfies 0.8<t<0.97.

10. A magnetoresistance effect element according to claim 9, wherein element B of the $(AB)_2O_x$ layer comprises at least one transition metal, and has Fe as a major component.

11. A magnetoresistance effect element according to claim 9, wherein element of the $(AB)_zO_x$ layer comprises at least one element selected from rare earth metals.

12. A magnetoresistance effect element according to claim 1 further comprising:
    a pinning layer magnetically coupled to the first pinned layer.

13. A magnetoresistance effect element according to claim 1, wherein the first pinned layer further comprises a second metal magnetic film provided on a side opposite to the first metal magnetic film of the first oxide magnetic film.

14. A magnetoresistance effect element according to claim 13, wherein the first pinned layer further comprises:
    a third metal magnetic film; and
    an exchange-coupling non-magnetic film antiferromagnetically exchange-coupling the second and third metal magnetic films.

15. A magnetoresistance effect element according to claim 13, wherein the free layer comprises a non-magnetic film and two metal magnetic films which are antiferromagnetically exchange-coupled via the non-magnetic film; and the two films have different thicknesses or different levels of saturated magnetization.

16. A magnetoresistance effect element according to claim 1, wherein the first pinned layer further comprises:
    a non-magnetic film provided on a side opposite to the first metal magnetic film of the first oxide magnetic film; and
    a second oxide magnetic film magnetically exchange-coupling the first oxide magnetic film via the non-magnetic films.

17. A magnetoresistance effect element according to claim 1, wherein the first oxide magnetic film comprises Fe.

18. A magnetoresistance effect element according to claim 1, wherein the first oxide magnetic film comprises Fe and X, where X is at least one element selected from Al, Si, B and N.

19. A magnetoresistance effect element according to claim 1, wherein the first oxide magnetic film comprises $MFe_2O_4$ as a major component where M is at least one element selected from Fe, Co, and Ni.

20. A magnetoresistance effect element according to claim 1, wherein the first oxide magnetic film comprises $Fe_3O_4$ as a major component.

21. A magnetoresistance effect element according to claim 1, wherein the first oxide magnetic film comprises $CoFe_2O_4$ as a major component.

22. A magnetoresistance effect element according to claim 1, wherein the first oxide magnetic film is an oxide of the first metal magnetic film.

23. A magnetoresistance effect element according to claim 22, the first metal magnetic film comprises a Co—Fe alloy.

24. A magnetoresistance effect element according to claim 1, wherein the magnetoresistance effect element further comprises electrodes provided on the upper and lower sides thereof, and a current flows vertically through the magnetoresistance effect element.

25. A magnetoresistance effect type head comprising:
a magnetoresistance effect element according to claim 1; and
a shield.

26. A magnetic recording apparatus comprising:
a magnetoresistance affect type head according to claim 25;
a servo section for controlling the magnetoresistance effect type head to track a recording medium; and
a signal processing section for processing a signal which the magnetoresistance effect type head records or reproduces onto or from the recording medium.

27. A magnetoresistance effect type head comprising
a magnetoresistance effect element according to claim 1; and
a yoke for introducing a magnetic field into the magnetoresistance effect element.

28. A magnetoresistance effect memory element comprising:
a magnetoresistance effect element according to claim 1;
an information reading lead line for reading information from the magnetoresistance effect element; and
an information recording lead line for recording the information into the magnetoresistance effect element.

* * * * *

UNITED STATES PATENT AND TRADEMARK OFFICE
CERTIFICATE OF CORRECTION

PATENT NO.     : 6,567,246 B1
DATED          : May 20, 2003
INVENTOR(S)    : Hiroshi Sakakima et al.

It is certified that error appears in the above-identified patent and that said Letters Patent is hereby corrected as shown below:

<u>Column 29,</u>
Line 50, "layers" should be -- layer --; and
Line 52, after "non-magnetic layer", insert a -- , --.

<u>Column 31,</u>
Line 8, after "22," should be -- wherein --;
Line 12, after "thereof", the "," should be a -- ; --; and
Line 19, "affect" should be -- effect --.

Signed and Sealed this

Seventh Day of October, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,567,246 B1
DATED : May 20, 2003
INVENTOR(S) : Hiroshi Sakakima et al.

It is certified that error appears in the above-identified patent and that said Letters Patent is hereby corrected as shown below:

<u>Column 29,</u>
Line 50, "layers" should be -- layer --; and
Line 52, after "non-magnetic layer", insert a -- , --.

<u>Column 31,</u>
Line 8, after "22," should be -- wherein --;
Line 12, after "thereof", the "," should be a -- ; --; and
Line 19, "affect" should be -- effect --.

Signed and Sealed this

Twenty-seventh Day of January, 2004

JON W. DUDAS
*Acting Director of the United States Patent and Trademark Office*